United States Patent
Taniguchi et al.

(10) Patent No.: US 8,842,707 B2
(45) Date of Patent: Sep. 23, 2014

(54) SEMICONDUCTOR LASER ELEMENT AND METHOD OF MANUFACTURING SEMICONDUCTOR LASER ELEMENT

(75) Inventors: Hidehiro Taniguchi, Tokyo (JP); Hirotatsu Ishii, Tokyo (JP); Takeshi Namegaya, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/716,315

(22) Filed: Mar. 3, 2010

(65) Prior Publication Data

US 2010/0195685 A1  Aug. 5, 2010

Related U.S. Application Data

(63) Continuation of application No. PCT/JP2007/067231, filed on Sep. 4, 2007.

(51) Int. Cl.
- *H01S 5/00* (2006.01)
- *H01S 5/16* (2006.01)
- *H01S 5/20* (2006.01)
- *H01S 5/30* (2006.01)

(52) U.S. Cl.
CPC ............... *H01S 5/164* (2013.01); *H01S 5/2072* (2013.01); *H01S 5/162* (2013.01); *H01S 5/3054* (2013.01)
USPC ............... 372/45.01; 372/40.012; 372/46.016

(58) Field of Classification Search
CPC ........... H01S 5/16; H01S 5/162; H01S 5/164; H01S 5/168
USPC ............................. 372/45.01, 45.012, 46.016
See application file for complete search history.

(56) References Cited

U.S. PATENT DOCUMENTS

| | | | | |
|---|---|---|---|---|
| 5,228,047 A | * | 7/1993 | Matsumoto et al. | 372/45.01 |
| 5,376,582 A | | 12/1994 | Behfar-Rad et al. | |
| 5,513,199 A | * | 4/1996 | Haase et al. | 372/44.01 |
| 5,568,501 A | * | 10/1996 | Otsuka et al. | 372/46.01 |
| 2003/0042492 A1 | | 3/2003 | Watanabe | |
| 2003/0128730 A1 | * | 7/2003 | Ohkubo | 372/46 |
| 2003/0206566 A1 | * | 11/2003 | Ohitsu et al. | 372/45 |

(Continued)

FOREIGN PATENT DOCUMENTS

| | | |
|---|---|---|
| EP | 1 699 121 A1 | 9/2006 |
| JP | 07-122816 | 5/1995 |
| JP | 2007-242718 | 9/2007 |

OTHER PUBLICATIONS

Hidehiro Taniguchi et al., "IFVD Mado Kozo ni yoru 9xx nm Koshutsuryoku Handotai Laser", IEICE Technical Report, vol. 106, No. 404 (LQ2006 103-117), Dec. 1, 2006, pp. 49 to 53.

(Continued)

*Primary Examiner* — Tod T Van Roy
(74) *Attorney, Agent, or Firm* — Oblon, Spivak, McClelland, Maier & Neustadt, L.L.P.

(57) ABSTRACT

A semiconductor laser element includes: a window region including a disordered portion formed by diffusion of a group-III vacancy, the diffusion promoted by providing on the window region a promoting film that absorbs a predetermined atom; a non-window region including an active layer of a quantum well structure; and a difference equal to or larger than 50 meV between an energy band gap in the window region and an energy band gap in the non-window region.

11 Claims, 20 Drawing Sheets

(56) References Cited

U.S. PATENT DOCUMENTS

| | | |
|---|---|---|
| 2004/0066822 A1* | 4/2004 | Ohkubo ................... 372/46 |
| 2006/0126688 A1* | 6/2006 | Kneissl .................. 372/43.01 |
| 2007/0096142 A1* | 5/2007 | Tachibana et al. ........... 257/103 |

OTHER PUBLICATIONS

Taniguchi et al., "25W 915nm Lasers with Window Structure Fabricated by Impurity Free Vacancy Disordering (IFVD)," 2006 IEEE 20th International Semiconductor Laser Conference, pp. 33-34, Sep. 17-21, 2006.

Hofler et al., "Direct Evidence for Interstitial Carbon in Heavily Carbon-Doped GaAs," Advanced III-V Compound Semiconductor Growth, Processing Devices Symposium, Mat. Res. Soc. Symp. Proc. vol. 240, pp. 51-56, 1992.

Ky et al., "Self-Interstitial Mechanism for Zn Diffusion-Induced Disordering of GaAs/$Al_xGa_{1-x}As$ (x=0.1-1) Multiple-Quantum-Well Structures," Journal of Applied Physics, vol. 73, No. 8, pp. 3769-3781, Apr. 15, 1993.

T. Ahlgren, "Identification of Silicon Interstitials in Ion Implanted GaAs," Physical Review Letters, vol. 81, No. 4, pp. 842-845, Jul. 27, 1998.

Extended European Search Report issued in European Patent Application No. 07806686.7 on Jun. 10, 2014.

* cited by examiner

SEMICONDUCTOR LASER ELEMENT AND METHOD OF MANUFACTURING SEMICONDUCTOR LASER ELEMENT

CROSS-REFERENCE TO RELATED APPLICATIONS

This application is a continuation of PCT International Application No. PCT/JP2007/067231 filed on Sep. 4, 2007, the entire contents of which are incorporated herein by reference.

BACKGROUND OF THE INVENTION

1. Field of the Invention

The present invention relates to a semiconductor laser element including a window region with a disordered portion formed by diffusion of group-III vacancies, and a non-window region with an active layer of a quantum well structure, where a promoting film that absorbs a predetermined atom to promote the diffusion of the group-III vacancies is provided on the window region to form the disordered portion, and to a method of manufacturing the semiconductor laser element.

2. Description of the Related Art

Conventionally, in semiconductor laser elements that output laser beams by amplifying light generated by recombination of carriers within active layers, light-emitting facets may be degraded due to strong light densities and damage called catastrophic optical damage (COD) may be caused. As a countermeasure against this damage, it has been proposed to provide window regions that absorb less laser light than the insides of active layers, by increasing energy-band gaps at light-emitting facets.

In recent years, to form a window region in a GaAs semiconductor laser element, there has been proposed a technique using an impurity free vacancy disordering (IFVD) method of disordering a region corresponding to the window region by performing a predetermined thermal treatment after depositing a promoting film formed correspondingly to the window region to promote diffusion of Ga and a suppression film formed correspondingly to a non-window region to suppress the diffusion of Ga (see Japanese Patent Application Laid-open No. H7-122816).

DISCLOSURE OF INVENTION

Problem to be Solved by the Invention

However, even the window region disordered using the IFVD method may absorb laser light of a wavelength corresponding to higher-order energy oscillation. Therefore, there has been a problem that, when the semiconductor laser element is driven under severe conditions, the semiconductor laser element is degraded due to COD, and a highly reliable semiconductor laser element is not obtainable.

SUMMARY OF THE INVENTION

A semiconductor laser element according to an aspect of the present invention includes: a window region including a disordered portion formed by diffusion of a group-III vacancy, the diffusion promoted by providing on the window region a promoting film that absorbs a predetermined atom; a non-window region including an active layer of a quantum well structure; and a difference equal to or larger than 50 meV between an energy band gap in the window region and an energy band gap in the non-window region.

A semiconductor laser element according to another aspect of the present invention includes: a window region including a disordered portion formed by diffusion of a group-III vacancy, the diffusion promoted by providing on the window region a promoting film that absorbs a predetermined atom; a non-window region including an active layer of a quantum well structure; and a layer near the active layer, the layer being doped with an impurity that preferentially substitutes a group-V site.

A manufacturing method, according to still another aspect of the present invention, for a semiconductor laser element including a window region with a disordered portion formed by diffusion of a group-III vacancy and a non-window region including an active layer of a quantum well structure, includes: forming on the window region a promoting film that absorbs a predetermined atom and promotes the diffusion of the group-III vacancy; and forming, near the active layer, a layer doped with an impurity that preferentially substitutes a group-V site.

The above and other features, advantages, and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
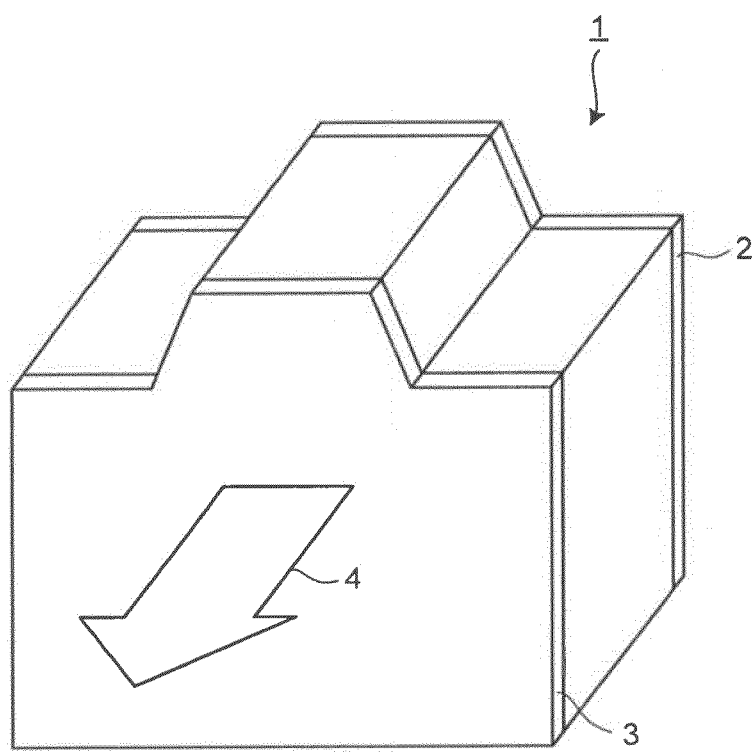
FIG. 1 is a perspective view of a semiconductor laser element according to a first embodiment.

Embodiments of a semiconductor laser element according to the present invention formed using the IFVD method will be explained below with reference to the accompanying drawings. The present invention is not limited by these embodiments. Furthermore, in the drawings, like parts are denoted by like reference numerals. Further, the drawings are schematic, and it should be noted that the relationship between a thickness and a width of each layer and the ratios among the layers may be different from the actual. The relationship between sizes and the ratios may also be different among the drawings.

(First Embodiment)

Figure 2:
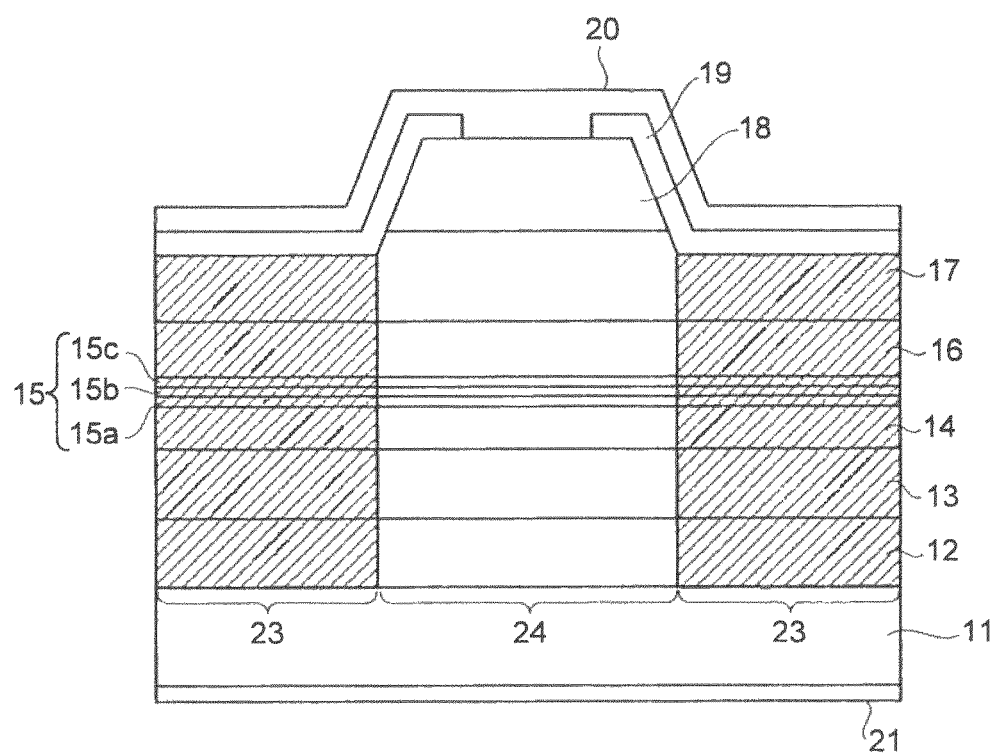
FIG. 2 is a cross section of the semiconductor laser element depicted in FIG. 1.
Figure 3:
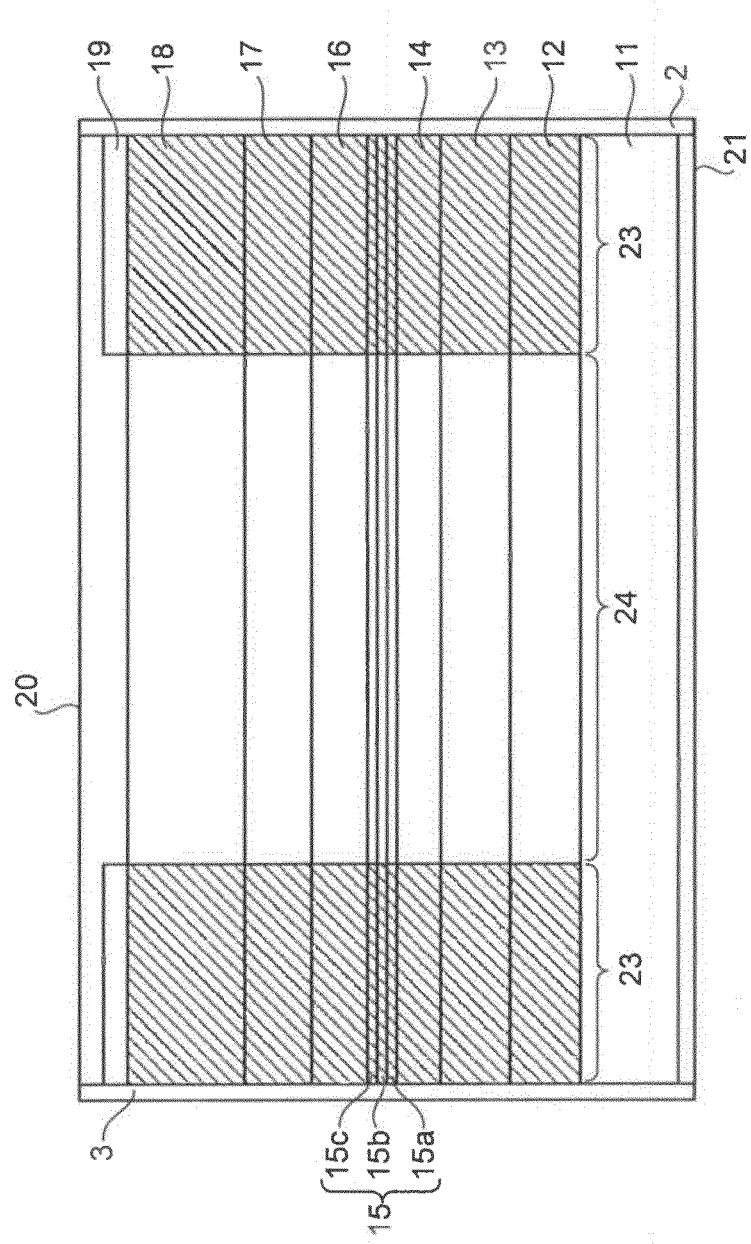
FIG. 3 is a longitudinal section of the semiconductor laser element depicted in FIG. 1.

A semiconductor laser element according to a first embodiment is explained first. The semiconductor laser element according to the first embodiment has C (carbon) doped as an impurity into a layer formed to inject a positive hole into an active layer. FIG. 1 is a perspective view of the semiconductor laser element according to the first embodiment. FIG. 2 is a cross section of the semiconductor laser element depicted in FIG. 1. FIG. 3 is a longitudinal cross section of the semiconductor laser element depicted in FIG. 1.

As depicted in FIG. 1, a semiconductor laser element 1 according to the first embodiment has a ridge structure constricting a current in a striped form, has a high reflection film 2 formed at a reflection end of laser light 4, and has a low reflection film 3 formed at an exit end of the laser light. Laser light generated inside the semiconductor laser element 1 and laser light reflected at the high reflection film 2 are transmitted through the low reflection film 3, and are emitted to the outside.

A structure of the semiconductor laser element 1 depicted in FIG. 1 is explained next with reference to FIG. 2 and FIG. 3. As depicted in FIG. 2 and FIG. 3, in the semiconductor laser element 1, an n-buffer layer 12, an n-cladding layer 13, an n-guide layer 14, an active layer 15, a p-guide layer 16, a p-cladding layer 17, a p-contact layer 18, and an insulation layer 19 are sequentially stacked on a substrate 11, which is an n-GaAs substrate. The semiconductor laser element 1 has an upper electrode 20 formed above the p-contact layer 18 and a lower electrode 21 formed below the substrate 11. An impurity, which is C, is doped into the p-guide layer 16 formed on a side of stacking a p-type cladding, that is, above the active layer 15, into the p-cladding layer 17 formed on the side of stacking the p-type cladding with respect to the active layer 15, and into the p-contact layer 18 formed to inject the positive hole into the active layer 15. As depicted in FIG. 2 and FIG. 3, the semiconductor laser element 1 has a ridge structure constricting in a striped form a current injected into the active layer 15, and functioning as an optical waveguide along the stripe. The semiconductor laser element 1 is processed in a mesa form in which a width of a layer region including an upper part of the p-cladding layer 17 plus the p-contact layer 18 is narrowed down in a direction perpendicular to a laser-light emission direction. A window region 23 that absorbs less laser light than a non-window region 24 is provided at a light-emitting facet of the semiconductor laser element 1. The window region 23 includes a disordered portion formed by diffusion of group-III vacancies, and the non-window region 24 has the active layer 15 of a quantum well structure and does not include the disordered portion. By disordering the window region 23, an energy band gap in the window region 23 is increased such that its difference from an energy band gap in the non-window region 24 becomes equal to or greater than 50 meV to suppress absorption of laser light and prevent COD.

The substrate 11 is made of a material including n-GaAs. The n-buffer layer 12 is a buffer layer necessary for growing a stacked structure of high-quality epitaxial layers on the substrate 11, and is made of a layer material including n-GaAs. The n-cladding layer 13 and the n-guide layer 14 have refractive indices and thicknesses, which are determined to achieve an arbitrary optical confinement state with respect to a stacking direction, and are made of materials including n-AlGaAs. Preferably, an Al composition in the n-guide layer 14 is equal to or greater than 20% and less than 40%. An Al composition in the n-cladding layer 13 is usually set greater than the Al composition in the n-guide layer 14 to decrease its refractive index. In a high-output horizontal multi-mode oscillation element formed with the window region according to the present invention, a film thickness of the n-guide layer 14 is preferably equal to or larger than 200 nanometers, for example, about 400 nanometers. A thickness of the n-cladding layer 13 is preferably equal to or larger than 1 micrometer, and may be about 3 micrometers. An intentionally not-doped high-purity layer may be used as the n-guide layer 14, but if a thickness of the n-guide layer 14 is set equal to or larger than 100 nanometers, influence by a residual impurity is large, and thus doping is preferably performed.

The active layer 15 includes a lower barrier layer 15a, a quantum well layer 15b, and an upper barrier layer 15c. The lower barrier layer 15a and the upper barrier layer 15c have a function of a barrier that confines carriers in the quantum well layer 15b, and are made of materials including intentionally not-doped high-purity AlGaAs. The quantum well layer 15b is made of a material including intentionally not-doped high-purity InGaAs. Light-emission recombined energy of the confined carriers is determined by a structure of a potential well determined by an In composition and a film thickness of the quantum well layer 15b and compositions of the lower barrier layer 15a and the upper barrier layer 15c. While a structure of a single quantum well layer (SQW) has been explained above, a structure of a multi-quantum well layer (MQW) with the quantum well layer 15b, the lower barrier layer 15a, and the upper barrier layer 15c stacked repeatedly by a predetermined number of times may be provided. While a structure of an intentionally not-doped high-purity layer has been explained above, donors and acceptors may be intentionally added to the quantum well layer 15b, the lower barrier layer 15a, and the upper barrier layer 15c. Further, because the lower barrier layer 15a and the n-guide layer 14 may have a same composition, and the upper barrier layer 15c and the p-guide layer 16 may have a same composition, the lower barrier layer 15a and the upper barrier layer 15c are not necessarily structured.

The p-guide layer 16 and the p-cladding layer 17 pair with the above-described n-cladding layer 13 and the n-guide layer 14, and their refractive indices and thicknesses are determined to achieve an arbitrary confinement state with respect to the stacking direction. The p-guide layer 16 and the p-cladding layer 17 are made of materials including p-AlGaAs. An Al composition of the p-guide layer 16 is generally equal to or greater than 20%, and is preferably equal to or greater than 30%. This is to increase an energy shift in the window region 23, which is a change in an energy band gap due to disordering, and to perform highly selective disordering in the window region 23 adequately. An Al composition in the p-cladding layer 17 is usually 40% to 50%. To decrease a waveguide loss by shifting an optical field in the layer towards the n-cladding layer 13, the Al composition in the p-cladding layer 17 is set a little greater than that in the n-cladding layer 13. An Al composition in the p-guide layer 16 is set smaller than the Al composition in the p-cladding layer 17. In the high-output horizontal multi-mode oscillation element formed with the window region according to the present invention, a film thickness of the p-guide layer 16 is preferably equal to or larger than 200 nanometers, for example, about 400 nanometers. A thickness of the p-cladding layer 17 is preferably around 1 to 2 micrometers. An intentionally not-doped high-purity layer may be used as the p-guide layer 16, but if a thickness of the guide layer is set equal to or larger than 100 nanometers, influence by conductivity variation due to a residual impurity is large, and thus to increase manufacture reproducibility, intentional doping is preferably performed.

Carbon (C) is doped as an acceptor impurity, into the p-cladding layer 17 and the p-guide layer 16. Concentration of C in the p-guide layer 16 is set to 0.1 to $1.0 \times 10^{17}$ cm$^{-3}$, and is preferably about 0.5 to $1.0 \times 10^{17}$ cm$^{-3}$. In the p-cladding layer 17, it is set equal to or higher than $1.0 \times 10^{17}$ cm$^{-3}$.

The p-contact layer 18 is for making the p-cladding layer 17 come in Ohmic contact with the upper electrode 20. The p-contact layer 18 is made of a layer material including p-GaAs. A high concentration of C is doped into the p-contact layer 18, thereby achieving the Ohmic contact.

Figure 4:
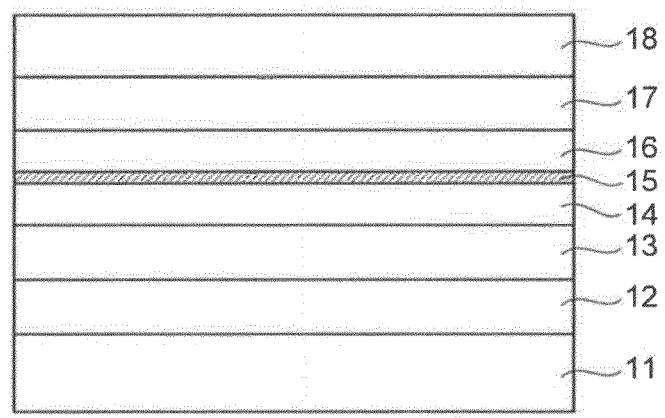
FIG. 4 is an explanatory diagram for a manufacturing method of the semiconductor laser element according to the first embodiment.

A manufacturing method of the semiconductor laser element 1 is explained next with reference to FIG. 4 to FIG. 8. First, as depicted in FIG. 4, the n-buffer layer 12, the n-cladding layer 13, the n-guide layer 14, the active layer 15, the p-guide layer 16, the p-cladding layer 17, and the p-contact layer 18 are formed on the substrate 11 by epitaxial growth. Carbon (C) is doped as an impurity in the p-guide layer 16, the p-cladding layer 17, and the p-contact layer 18.

Figure 5:
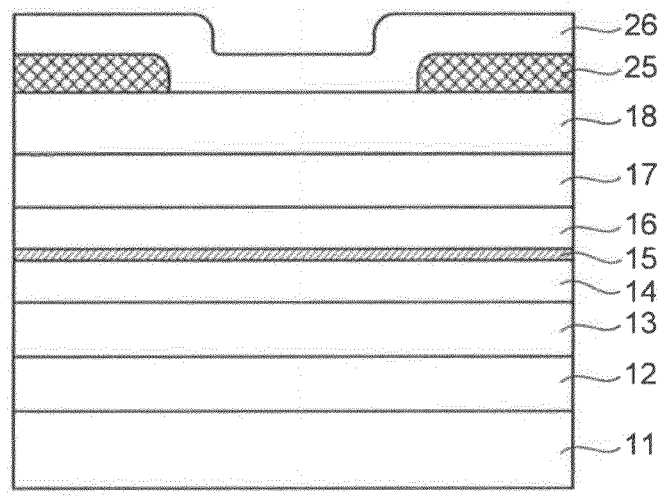
FIG. 5 is an explanatory diagram for the manufacturing method of the semiconductor laser element according to the first embodiment.

Next, 100 nanometers, for example, of SiN$_x$ is deposited on the p-contact layer 18 by using a catalytic chemical vapor deposition (CVD) method. This SiN$_x$ film has a higher proportion of N than the stoichiometric composition, and is formed in a state in which flow rates of silane and ammonia, which are the raw materials, are adjusted to be ammonia rich. Thereafter, SiN$_x$ in a region other than a region corresponding to the window region 23 is removed by performing photolithography and etching, thereby forming a promoting film 25 as depicted in FIG. 5. Because the promoting film 25 is a film formed of SiN$_x$ in an N-rich condition, it is a sparse film. The promoting film 25 needs to be formed to include a facet from which laser light is emitted. The promoting film 25 is formed in a latticed form and a striped form on a plane of the semiconductor laser element 1, to cover the active layer 15 when viewed from a laser-light emission side. Next, 30 nanometers, for example, of a SiN$_x$ film formed in a Si-rich condition is deposited on the p-contact layer 18 and the promoting film 25 by using the catalytic CVD method, thereby forming a suppression film 26. This SiN$_x$ has a higher proportion of Si than the stoichiometric composition. Because the suppression film 26 is formed by the catalytic CVD method, it becomes a dense film. The promoting film 25 may be formed after a SiN$_x$ film for forming a suppression film 26 is formed and the SiN$_x$ corresponding to the window region 23 is removed to form the suppression film 26.

Figure 6:
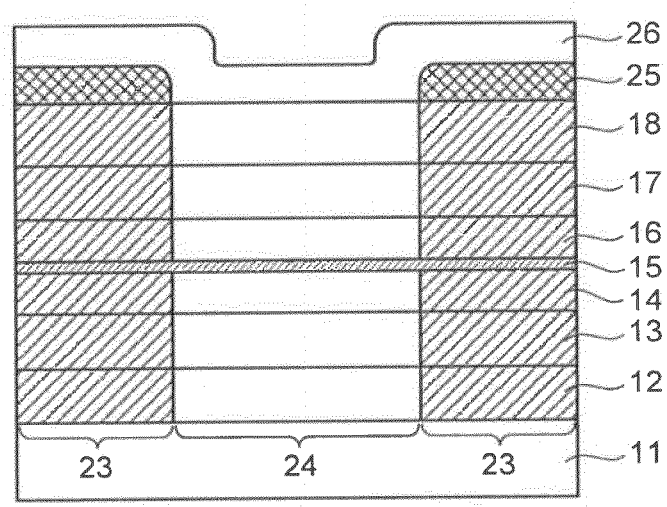
FIG. 6 is an explanatory diagram for the manufacturing method of the semiconductor laser element according to the first embodiment.

Rapid thermal annealing (RTA) is performed next for 30 seconds at 915° C., for example. Because the promoting film 25 is a sparse film, the film is able to absorb diffused Ga. Therefore, the promoting film 25 absorbs Ga in each layer positioned below the promoting film 25 by the RTA. Vacancies are generated on a surface of the p-contact layer 18 contacting the promoting film 25 below the promoting film 25, and the vacancies are diffused to the active layer 15. The quantum well layer 15b positioned below the promoting film 25 is disordered, thereby forming the window region 23 as depicted in FIG. 6. The promoting film 25 has a function of promoting disordering in the window region 23 by absorbing Ga and promoting the diffusion of vacancies. The suppression film 26 is formed to contact the p-contact layer 18 in a region where the promoting film 25 is not formed. Because the suppression film 26 is a dense film, it does not absorb Ga, and suppresses diffusion of Ga. As a result, in the region where the promoting film 25 is not formed, vacancies are not generated, disordering thus does not occur, and this region becomes the non-window region 24 that does not include the disordered portion. The suppression film 26 thus has a function of suppressing disordering in the non-window region 24.

Figure 7:
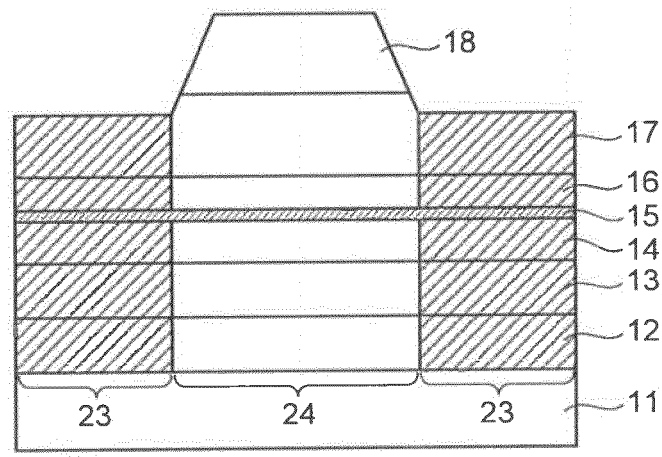
FIG. 7 is an explanatory diagram for the manufacturing method of the semiconductor laser element according to the first embodiment.
Figure 8:
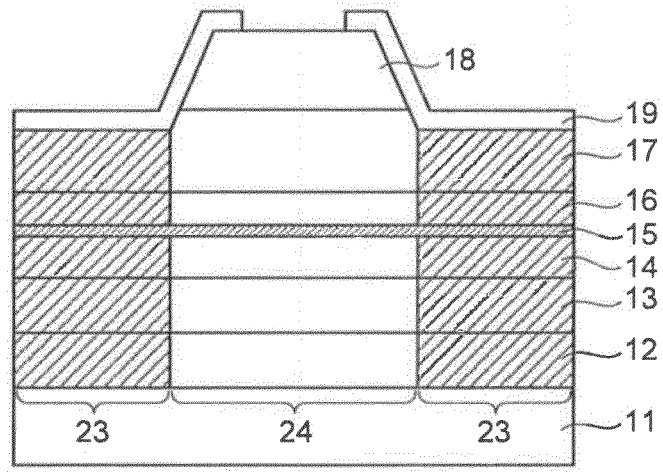
FIG. 8 is an explanatory diagram for the manufacturing method of the semiconductor laser element according to the first embodiment.

After the promoting film 25 and the suppression film 26 are removed, the p-contact layer 18 other than a region contacting the upper electrode 20 and an upper portion of the p-cladding layer 17 are removed to form a ridge structure, by performing photolithography and etching, as depicted in FIG. 7. After the insulation layer 19 is formed, the insulation layer 19 other than a region contacting the upper electrode 20 is removed, by performing photolithography and etching, as depicted in FIG. 8. After the upper electrode 20 and the lower electrode 21 are formed, a semiconductor wafer is cleaved, and the high reflection film 2 and the low reflection film 3 are formed on the cleaved surfaces, and each semiconductor laser elements 1 is cut out, thereby forming finally the semiconductor laser element 1.

As described above, in the semiconductor laser element 1 according to the first embodiment, C is doped as an impurity into the p-guide layer 16 which is a layer close to the active layer 15, and the p-cladding layer 17 and the p-contact layer 18, which are layers above the p-guide layer 16.

Figure 9:
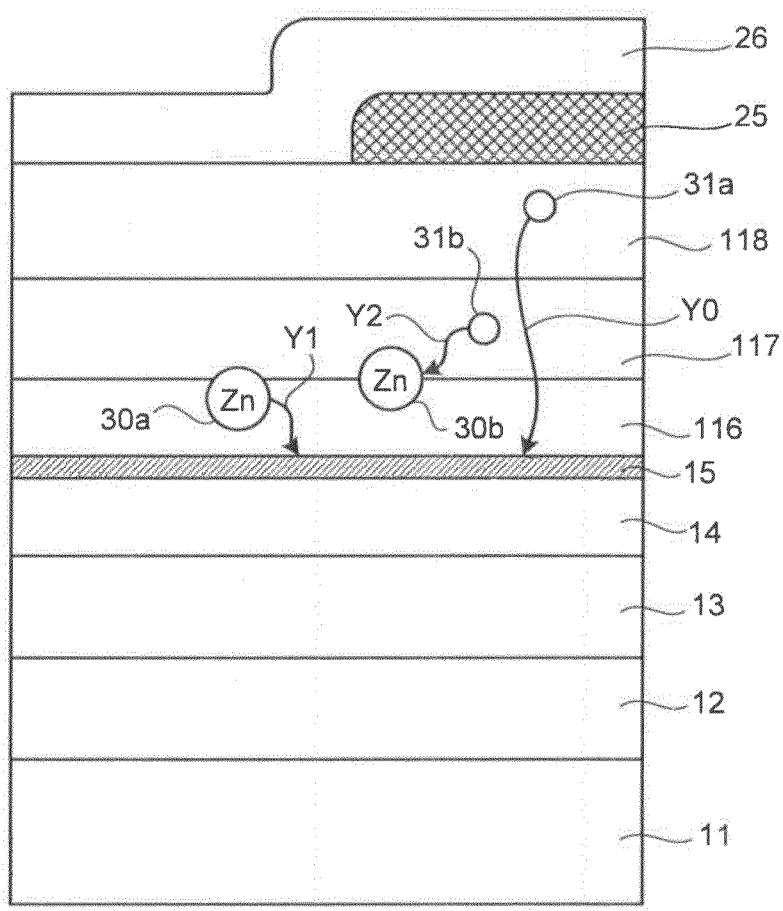
FIG. 9 is an explanatory diagram for diffusion of vacancies and interstitial Zn in a semiconductor laser element according to a conventional technique.

In a semiconductor laser element according to a conventional technique depicted in FIG. 9, Zn that preferentially substitutes a group-III site as an impurity is doped into a p-guide layer 116, a p-cladding layer 117, and a p-contact layer 118. Zinc has a large diffusion coefficient and high impurity diffusion performance, and easily generates interstitial atoms, and the generated interstitial atoms have a high diffusion velocity. When the promoting function of the promoting film 25 is functioning adequately, a group-III vacancy 31a generated by diffusion of Ga occupying the group-III reaches the active layer 15 to form a window region as indicated by an arrow Y0 in FIG. 9. However, an interstitial Zn 30b generated may recombine with a group-III vacancy 31b as indicated by an arrow Y2 in FIG. 9. Because the interstitial Zn 30b and the group-III vacancy 31b are both of group-III, they tend to be recombined easily. Particularly, Zn easily generates an interstitial atom, and a diffusion velocity of the generated interstitial atom is large. Therefore, a lot of the interstitial Zn and the group-III vacancies are considered to be recombined together. The vacancy concentration is then decreased, and sufficient vacancies do not reach the active layer 15. As a result, the promoting function of the promoting film 25 is degraded, and a large energy-band gap cannot be obtained in the window region 23.

Further, because Zn is easily diffused, an interstitial Zn 30a generated may reach the active layer 15 by RTA in the IFVD method as indicated by an arrow Y1 in FIG. 9. A laser oscillation performance of the quantum well layer 15b in the active layer 15 would then be hindered. Further, a function of suppressing disordering by the suppression film 26 would be degraded by the generation of the interstitial Zn 30a, and an energy band gap in the non-window region 24 would be increased. Therefore, in the conventional technique, it has not been possible to obtain a sufficient difference between the energy band gap in the window region and the energy band gap in the non-window region.

Figure 10:
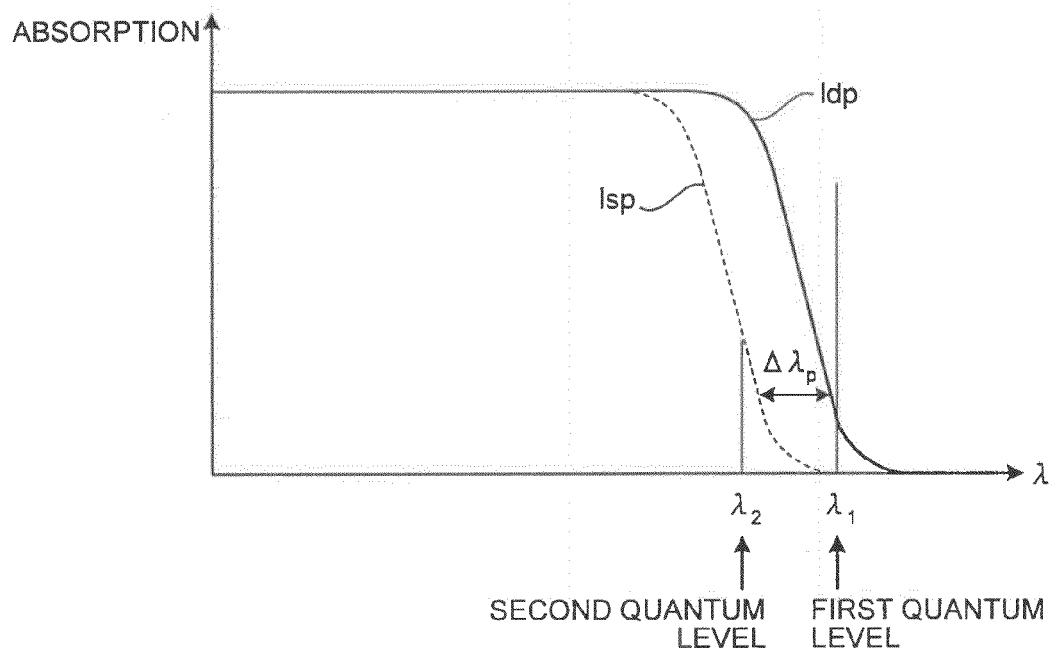
FIG. 10 depicts wavelength changes of light absorption amounts in a window region and a non-window region of the semiconductor laser element according to the conventional technique.

Consequently, in the conventional technique, a wavelength change of the light absorption amount in the window region, as indicated by a curve lsp in FIG. 10, may shift to a wavelength side longer than the setting, and light near a wavelength of oscillated laser light may be absorbed. A wavelength change of the light absorption amount in the non-window region, as indicated by a curve ldp in FIG. 10, may shift to a wavelength side shorter than a set wavelength of laser light.

Figure 11:
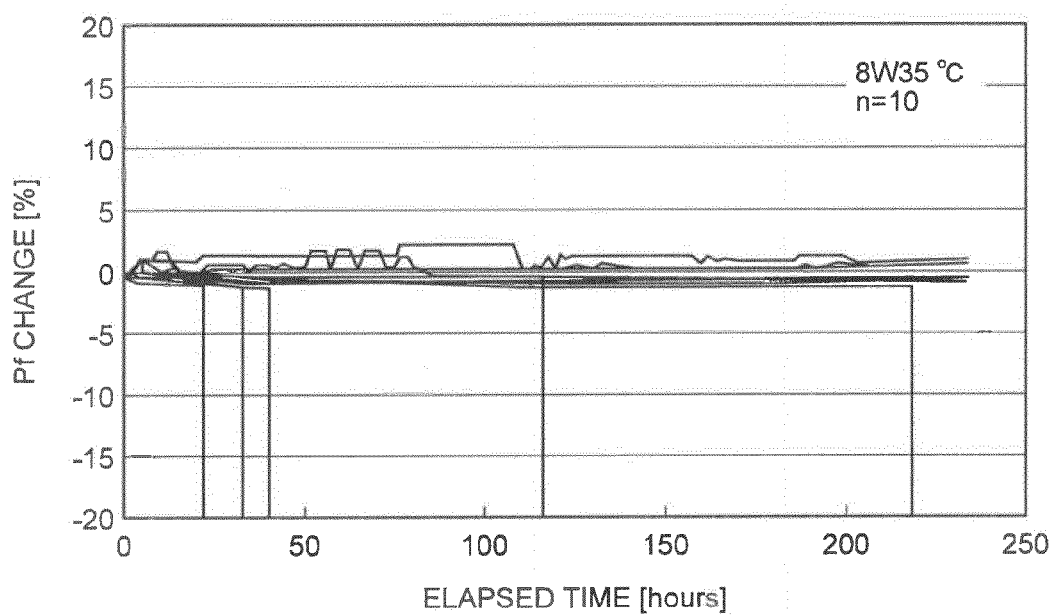
FIG. 11 depicts time dependency of a change in laser light intensity of the semiconductor laser element according to the conventional technique.

Therefore, as depicted in FIG. 10, in the conventional technique, a wavelength difference $\Delta\lambda_p$ between light absorbed in the window region and light absorbed in the non-window region becomes small, and absorption of laser light in the window region and degradation of the semiconductor laser element due to COD occurs. Particularly, when the semiconductor laser element is driven under severe conditions, laser light may be output, which has a wavelength $\lambda_2$ corresponding to a second quantum level, which is shorter than a wavelength $\lambda_1$ that corresponds to a first quantum level and is a set wavelength of laser light. In the conventional technique, laser light of this wavelength $\lambda_2$ is absorbed and COD occurs in the window region, as indicated by the curve lsp. In the window region, when not only laser light of the wavelength $\lambda_2$ but also laser light of a wavelength shorter than the wavelength $\lambda_1$ corresponding to a first quantum level and corresponding to higher-order energy oscillation caused by light holes is output, light of this wavelength is absorbed. As a result, in the conventional technique, intensity of laser light decreases in a short period of time, and a long-life semiconductor laser element maintaining high reliability could not be obtained, as indicated by a time dependency of a change in laser light intensity (Pf) in FIG. 11.

Figure 12:
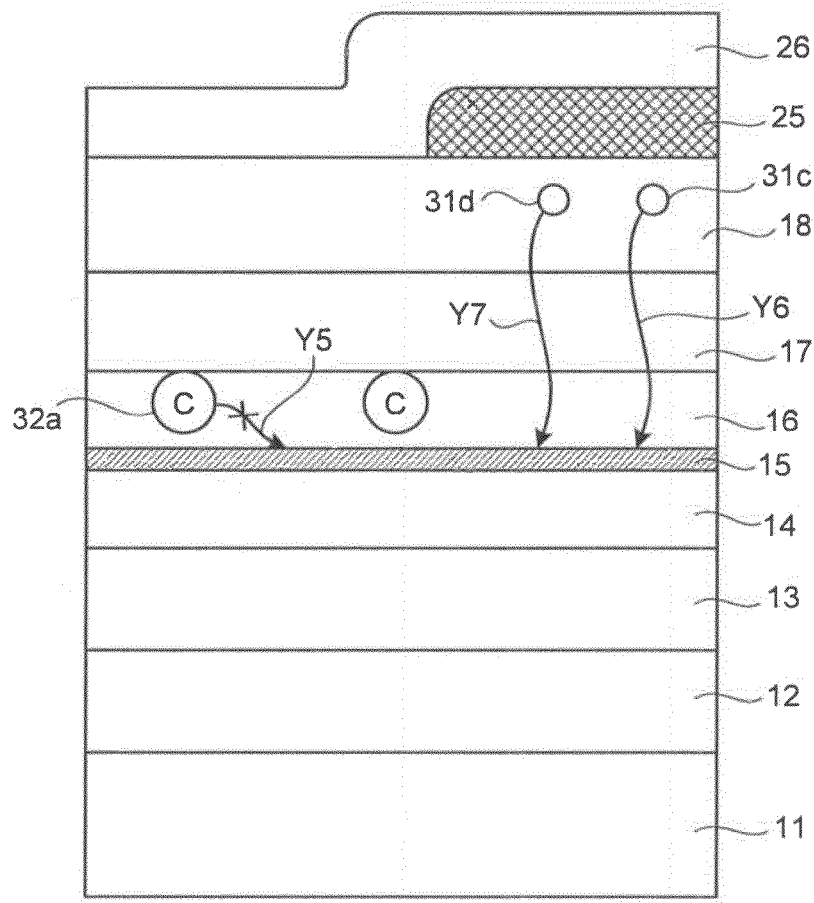
FIG. 12 is an explanatory diagram for diffusion of vacancies and C in the semiconductor laser element according to the first embodiment.

In contrast, in the semiconductor laser element 1 according to the first embodiment, C that preferentially substitutes the group-V site as an impurity is doped into the p-guide layer 16, the p-cladding layer 17, and the p-contact layer 18. Carbon has a very small diffusion coefficient. For example, the diffusion coefficient of C in a thermal treatment at 950° C. is equal to or smaller than $3\times10^{-14}$ cm$^2$/s. When a diffusion coefficient of an impurity is D and a diffusion time period is t, a diffusion length of the impurity is $(Dt)^{1/2}$. Specifically, when an impurity having a diffusion coefficient of $3\times10^{-14}$ cm$^2$/s is thermally treated at an RTA temperature for 30 seconds, a diffusion length of this impurity becomes about 9.5 nanometers as a result of calculation using $(Dt)^{1/2}$. Usually, because a material layer of a range of around 9.5 nanometers based on the active layer 15 is not doped with an impurity, the impurity having a diffusion coefficient of $3\times10^{-14}$ cm$^2$/s does not reach the active layer 15. Therefore, C having a diffusion coefficient of $3\times10^{-14}$ cm$^2$/s does not move to the active layer 15 as exemplified by an arrow Y5 in FIG. 12, even if RTA is performed. Consequently, even if C is doped into the p-guide layer 16, which is a layer above the active layer 15 like in the semiconductor laser element 1, the laser oscillation function of the quantum well layer 15b and the suppression function of the suppression film 26 are not inhibited by the doped C. As a result, increase in an energy band gap is adequately suppressed in the non-window region.

While C is a group-IV atom, C enters a group-V site and becomes an acceptor, in a group-III-V compound semiconductor such as GaAs in which a group-V element is As. In GaAs, C preferentially substitutes the group-V site, which is a group different from that of Ga occupying the group-III and absorbed in the promoting film 25. Therefore, C that occupies the group-V site does not easily recombine with group III vacancies 31c and 31d generated by diffusion of Ga in the promoting film 25. Consequently, in a region corresponding to the window region, vacancy concentration does not decrease by recombination, and the generated group-III vacancies 31c and 31d smoothly reach the active layer 15 to properly form the window region, as indicated by arrows Y6 and Y7. As a result, C used as the impurity does not hinder the promoting function of the promoting film 25, and thus a large energy band gap is obtained in the window region 23.

Figure 13:
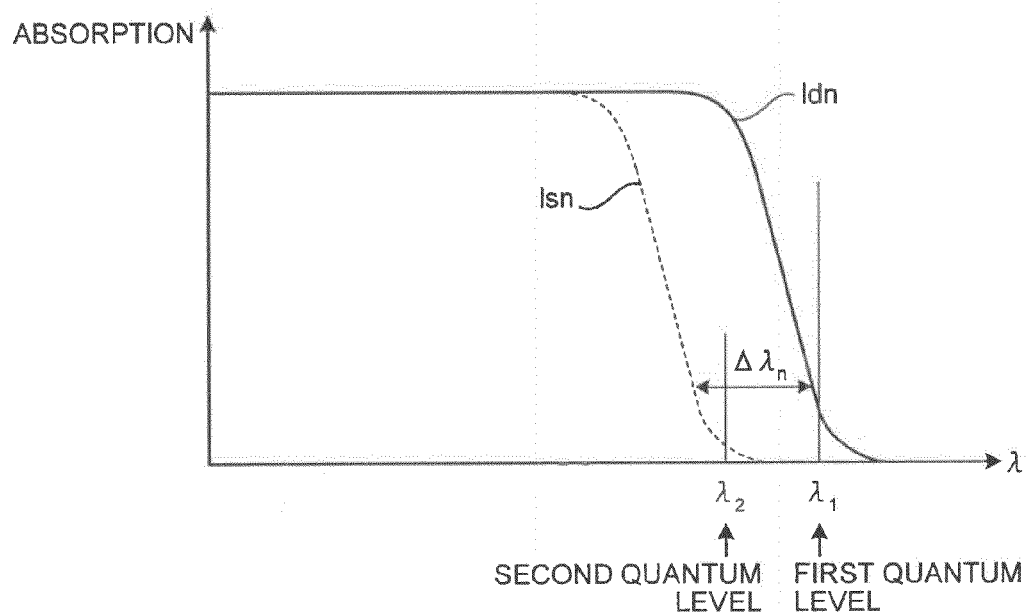
FIG. 13 depicts wavelength changes of light absorption amounts in a window region and a non-window region of the semiconductor laser element according to the first embodiment.

FIG. 13 depicts wavelength changes of light absorption amounts in the window region and the non-window region of the semiconductor laser element 1. In FIG. 13, a curve ldn indicates a wavelength change of a light absorption amount in the non-window region, and a curve lsn indicates a wavelength change of a light absorption amount in the window region. In the first embodiment, as a result of using C as the impurity, the promoting function of the promoting film 25 works adequately, disordering in the window region is performed sufficiently, and the suppression function of the suppression film 26 works adequately. As a result, a wavelength difference $\Delta\lambda_n$ between light absorbed in the window region and light absorbed in the non-window region, which is larger than that of the conventional technique is obtained. In other words, a sufficient difference between the energy band gap in the window region and the energy band gap in the non-window region is obtained in the semiconductor laser element 1. Further, as indicated by the curve lsn, in the window region, absorption of laser light of a wavelength corresponding to higher-order energy oscillation, such as the wavelength $\lambda_2$ corresponding to the second quantum level does not occur. Therefore, laser light of a wavelength corresponding to this higher-order energy oscillation is not absorbed and COD is not generated in the window region, even if driving under severe conditions and higher-order energy oscillation are performed. Because the suppression function of the suppression film 26 also functions adequately, in the non-window region, absorption characteristics as set are demonstrated as indicated by the curve ldn. Therefore, it is possible to precisely output laser light of a set wavelength.

Figure 14:
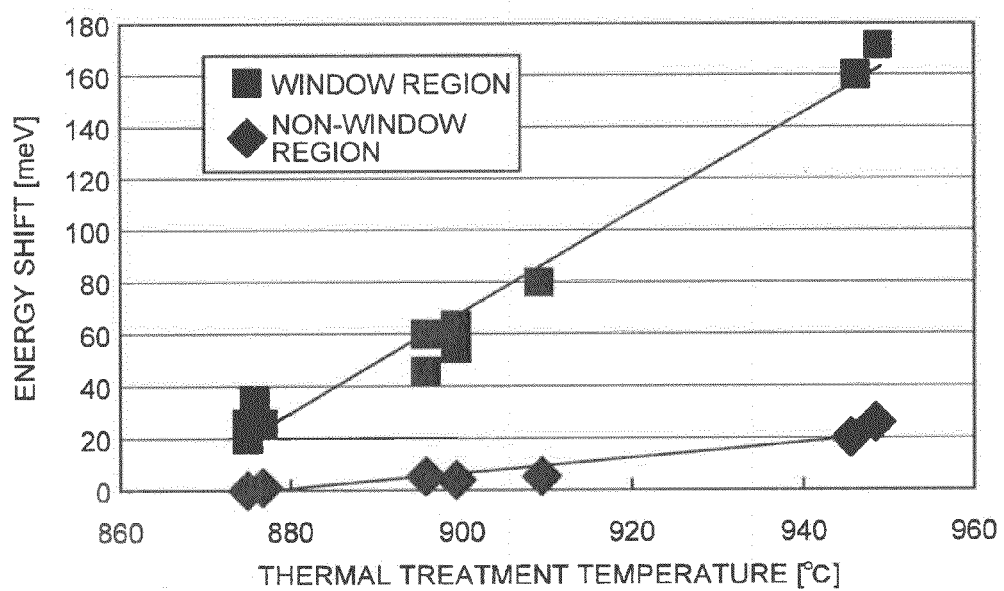
FIG. 14 depicts a relationship between thermal treatment temperatures of RTA and energy shift amounts in the window region and the non-window region of the semiconductor laser element according to the first embodiment.

Energy band gaps in the window region and the non-window region of the semiconductor laser element 1 are now explained. FIG. 14 depicts a relationship between thermal treatment temperatures of RTA performed for disordering and energy shift amounts in the window region and the non-window region of the semiconductor laser element 1. The energy shift amount is a change in an energy band gap changed by disordering. FIG. 14 depicts results for the semiconductor laser element 1 in which a doping amount of C at an active layer 15 side in the p-guide layer 16 is $5\times10^{16}$ cm$^{-3}$, a doping amount of C at an active layer 15 side in the p-cladding layer 17 is $5\times10^{17}$ cm$^{-3}$, and a doping amount of C at an active layer 15 side in the p-contact layer 18 is $3\times10^{19}$ cm$^{-3}$.

When promotion of disordering is performed adequately, a large energy-shift is exhibited in the window region, because an energy band gap after disordering becomes larger than that before disordering. As described above, in the first embodiment, it is possible to promote disordering in the window region adequately by doping C as the impurity. As depicted in FIG. 14, in the window region, when RTA is performed at a thermal treatment temperature of 900° C. or higher, an energy shift amount becomes equal to or greater than 60 meV, and an energy band gap is increased.

If disordering is suppressed adequately, a small energy shift is demonstrated in the non-window region, because a large change does not occur between the energy band gaps before and after the disordering. As described above, in the first embodiment, it is possible to adequately suppress disordering in the non-window region by doping C as the impurity. Therefore, as depicted in FIG. 14, energy shift is hardly recognized in the non-window region, when a thermal treatment temperature of RTA is 900° C. Only an energy shift amount of about 20 meV is exhibited when a thermal treatment temperature of RTA is as high as 950° C.

When a difference between an energy band gap in the window region and an energy band gap in the non-window region is equal to or larger than 50 meV, it is possible to suppress absorption of laser light in the window region and prevent COD. Even when light absorption at a facet is suppressed by employing a window structure, a facet region is an area where a local temperature increase easily occurs. As light emission intensity increases, a partial temperature increase cannot be avoided in many cases. When a temperature increases, an energy band gap of a semiconductor becomes small at about (−0.5) meV/° C. Therefore, a difference generated between an energy band gap in the window region and an energy band gap in the non-window region is set off. Consequently, if a difference between an energy band gap in the window region and an energy band gap in the non-window region can be set to 70 meV, a temperature difference ΔTw of about 20° C. between a temperature in the non-window region and a temperature in the window region is permissible. Further, if a difference between an energy band gap in the window region and an energy band gap in the non-window region can be set to 100 meV, a large ΔTw of about 50° C. is permissible. Therefore, the larger the difference that can be set is between the energy band gap in the window region and the energy band gap in the non-window region, the higher the output of the element achieved is. As described above, the difference between the energy band gap in the window region and the energy band gap in the non-window region needs to be equal to or greater than 50 meV, and is more preferably 70 meV, and even more preferably 100 meV. As depicted in FIG. 14, in the semiconductor laser element 1, the difference between the energy band gap in the window region and the energy band gap in the non-window region can be set equal to or larger than 50 meV, when RTA is performed at a thermal treatment temperature equal to or higher than 900° C. It is understood from the example in FIG. 14 that thermal treatment temperatures corresponding to energy differences between energy band gaps of 70 meV and 100 meV are about 905° C. and 925° C., respectively.

Therefore, in the first embodiment, the difference between the energy band gap in the window region and the energy band gap in the non-window region of 50 meV or greater is obtained by performing RTA at 900° C. or higher, thereby preventing COD.

Figure 15:
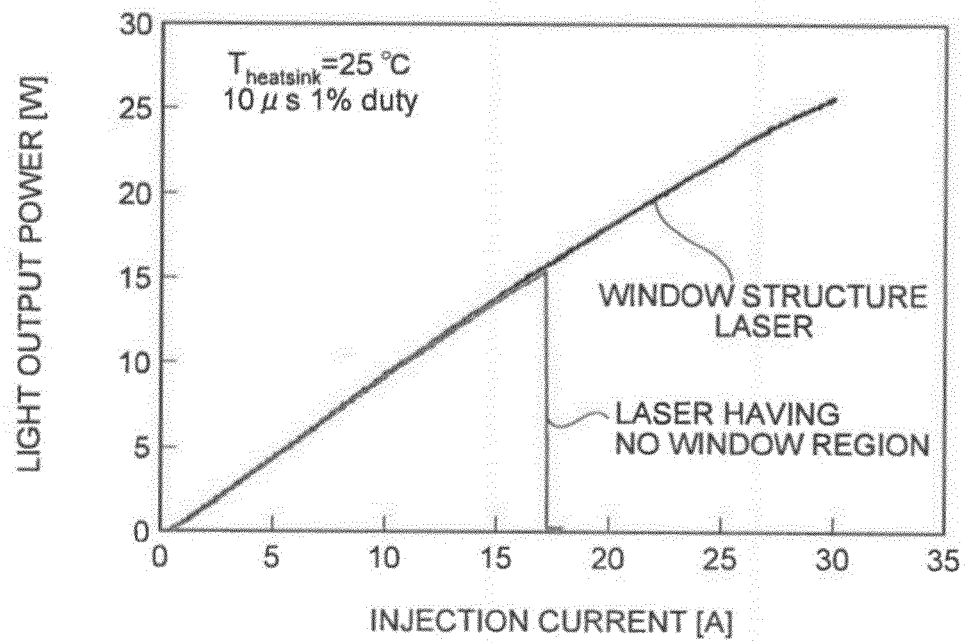
FIG. 15 depicts light output characteristics upon pulse driving of the semiconductor laser according to the first embodiment.

Output characteristics of laser light of the semiconductor laser element 1 according to the first embodiment are explained. FIG. 15 depicts optical output characteristics of pulse driving of a window structure laser having a difference between an energy band gap in the window region and an energy band gap in the non-window region of 65 meV, which is the semiconductor laser element 1 according to the first embodiment, and a laser without a window region as a reference. FIG. 15 depicts results for one of the semiconductor laser elements 1 for which results are illustrated in FIG. 14, which was subjected to RTA at 900° C. for 30 seconds. As depicted in FIG. 15, when a drive current is gradually increased to make conditions severe, COD generating destruction occurs around a drive current of 17 amperes in the laser without the window region. In contrast, in the window structure laser, which is the semiconductor laser element 1 according to the first embodiment, COD does not occur even if a drive current is increased to a measurement limit of 30 amperes, and it is possible to output laser light normally.

Figure 16:
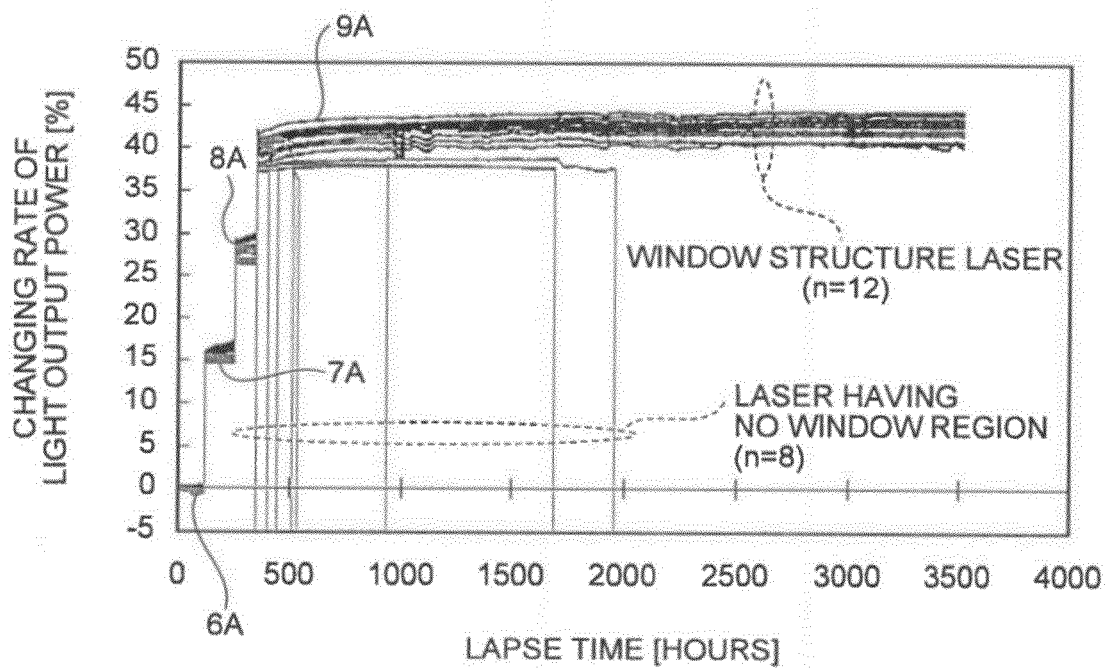
FIG. 16 depicts ageing test results of the semiconductor laser according to the first embodiment.

FIG. 16 depicts ageing test results of a window structure laser having a difference between an energy band gap in the window region and an energy band gap in the non-window region of 60 meV, which is the semiconductor laser element 1 according to the first embodiment, and a laser without a window region as a reference. FIG. 16 depicts results for one of the semiconductor laser elements 1 depicted in FIG. 14, which was subjected to RTA at 900° C. for 30 seconds. FIG. 16 depicts time dependencies of changing rates in optical output when drive current is increased in steps of 6, 7, 8, and 9 amperes. As depicted in FIG. 16, when a drive current is increased to create more severe conditions, intensity of laser light decreases in a short period of time in the laser without the window region, and a semiconductor laser element having a long life and maintaining high reliability could not be obtained. In contrast, the window structure laser, which is the semiconductor laser element 1 according to the first embodiment was able to maintain high intensity of laser light for a long period of time until the end of the test even when a drive current was increased to create the more severe conditions. That is, the window structure laser, which is the semiconductor laser element 1 according to the first embodiment, is able to maintain a long life while maintaining high reliability.

As explained above, in the first embodiment, it is possible to promote disordering in the window region and suppress disordering in the non-window region by doping C as the impurity instead of Zn in a layer formed on a side of stacking a p-cladding with respect to the active layer. As a result, in the first embodiment, it is possible to realize a highly reliable semiconductor laser element preventing COD even upon driving of the semiconductor laser element under severe conditions.

Figure 17:
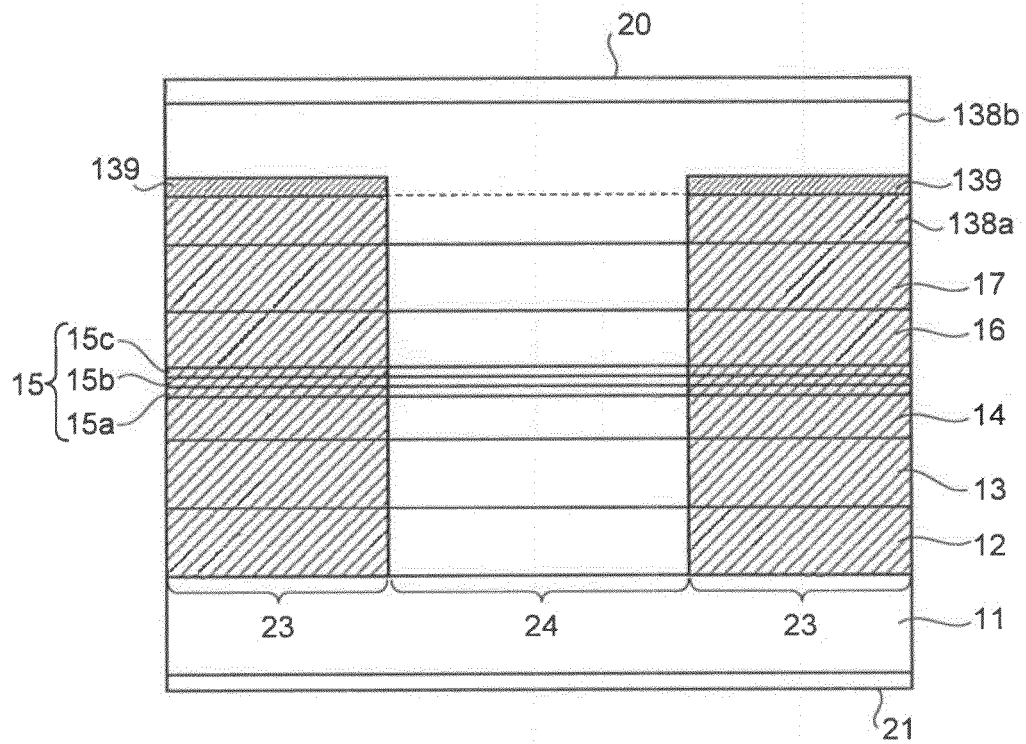
FIG. 17 is another example of a cross section of the semiconductor laser element according to the first embodiment.

While the semiconductor laser element 1 of a so-called ridge structure has been explained as the first embodiment, it may be a semiconductor laser element including a layer having a current constricting function. In this case, as depicted in FIG. 17, a current non-injecting layer 139 is provided between a p-first contact layer 138a doped with C as an impurity and a p-second contact layer 138b doped with C as an impurity. The p-second contact layer 138b doped with C of a higher concentration than that in the p-first contact layer 138a and the upper electrode 20 are formed on the p-first contact layer 138a and the current non-injecting layer 139. That is, C that preferentially substitutes a group-V site is doped into an active layer 15 side of the p-first contact layer 138a and the p-second contact layer 138b that are formed above the active layer 15 to inject carriers into the active layer 15. The p-first contact layer 138a and the p-second contact layer 138b are made of layer materials including p-GaAs. The current non-injecting layer 139 is a layer constricting a current injected from outside via the upper electrode 20 and supplying the constricted current to the active layer 15, thereby improving a carrier density in the quantum well layer 15b with respect to a horizontal direction. To prevent the current injected from the upper electrode 20 from passing through the inside, the current non-injecting layer 139 is made of a layer material including n-GaAs having n-type conductivity.

Figure 18:
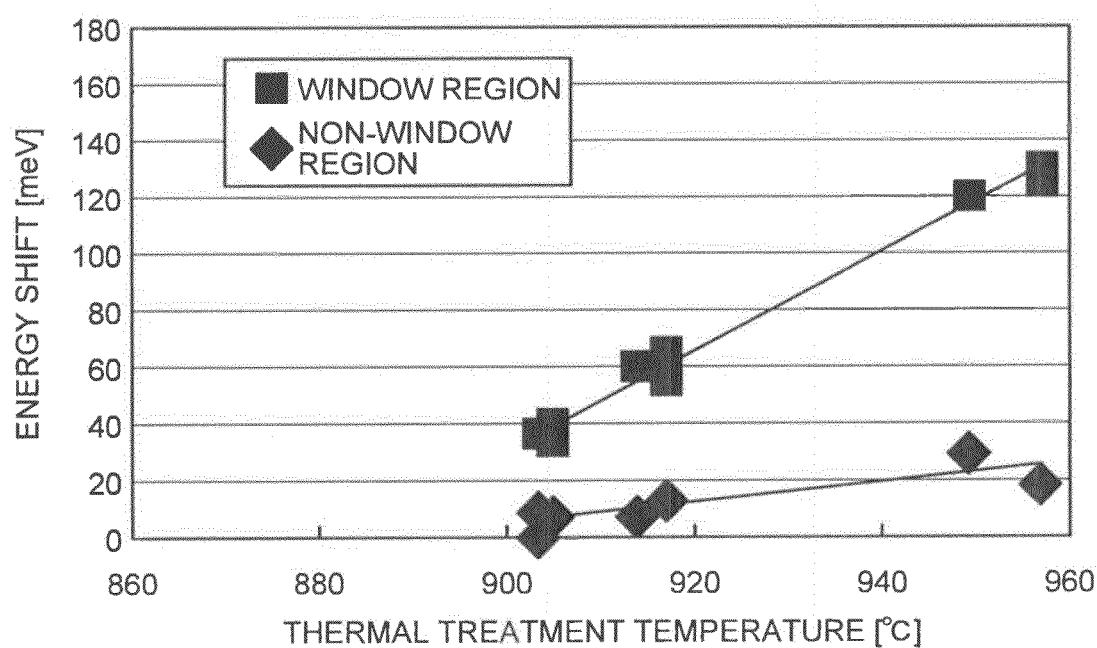
FIG. 18 depicts a relationship between thermal treatment temperatures of RTA and energy shift amounts in a window region and a non-window region of the semiconductor laser element depicted in FIG. 17.

As depicted in FIG. 17, in a semiconductor laser element including a layer having a current constricting function, by doping C as an impurity instead of Zn into a layer formed at a side of stacking a p-type cladding with respect to the active layer 15, it is possible to perform promotion of disordering in the window region and suppression of disordering in the non-window region adequately. As a result, as depicted in FIG. 18, it is possible to obtain a large energy-shift amount in the window region 23, and to decrease an energy shift amount in the non-window region 24. In this case, as depicted in FIG. 18, by performing RTA at 915° C. or higher, it is possible to obtain a difference between an energy band gap in the window region 23 and an energy band gap in the non-window region 24 of 50 meV or greater, and to realize a highly reliable semiconductor laser element preventing COD, similarly to the semiconductor laser element 1. While 50 meV or more of an energy difference between the energy band gaps is necessary, it is more preferably 70 meV, and even more preferably 100 meV. In an example of FIG. 18, an energy difference of 70 meV is achieved at around 930° C., and an energy difference of 100 meV is achieved at around 950° C. While the energy difference 100 meV is achieved at around 950° C. in the example of FIG. 18, a shift amount in the non-window region reaches 20 meV, and performance of the element may be slightly degraded.

Figure 19:
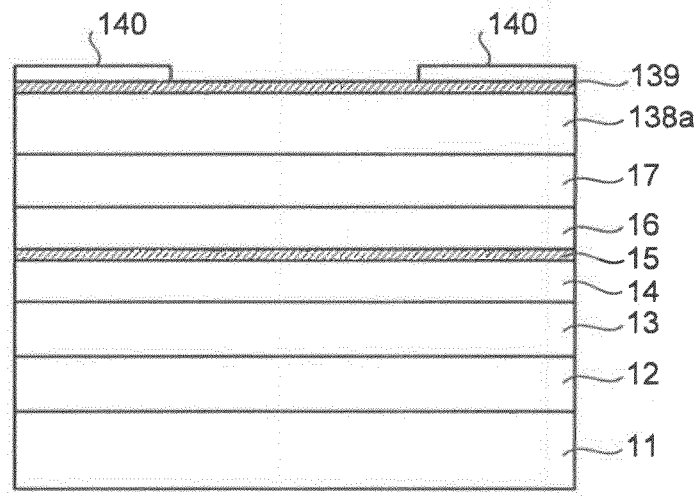
FIG. 19 is an explanatory diagram for a manufacturing method of the semiconductor laser element depicted in FIG. 17.
Figure 20:
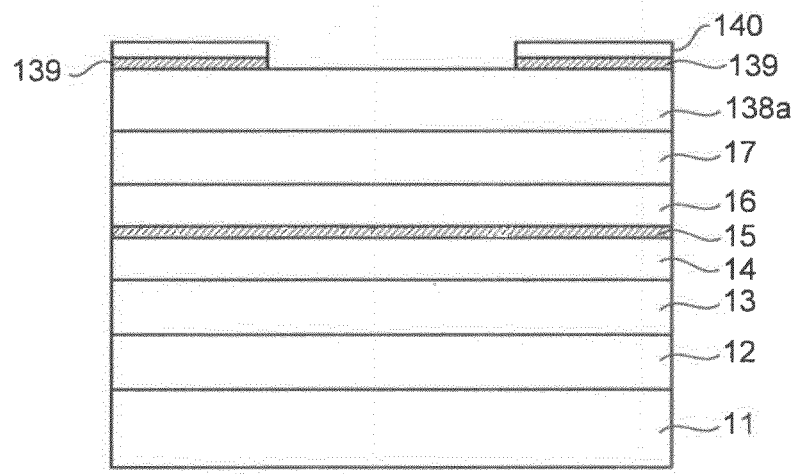
FIG. 20 is an explanatory diagram for the manufacturing method of the semiconductor laser element depicted in FIG. 17.
Figure 21:
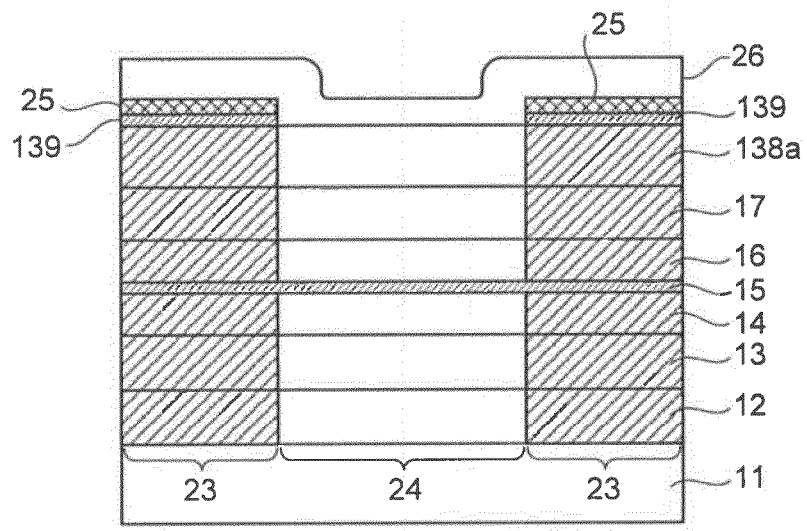
FIG. 21 is an explanatory diagram for the manufacturing method of the semiconductor laser element depicted in FIG. 17.
Figure 22:
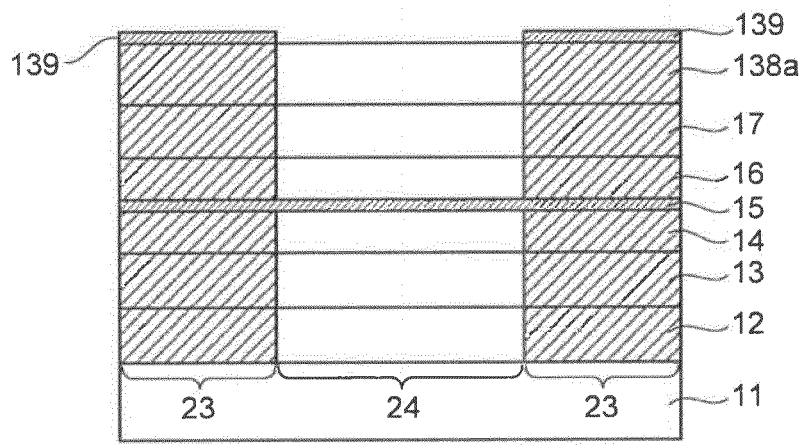
FIG. 22 is an explanatory diagram for the manufacturing method of the semiconductor laser element depicted in FIG. 17.
Figure 23:
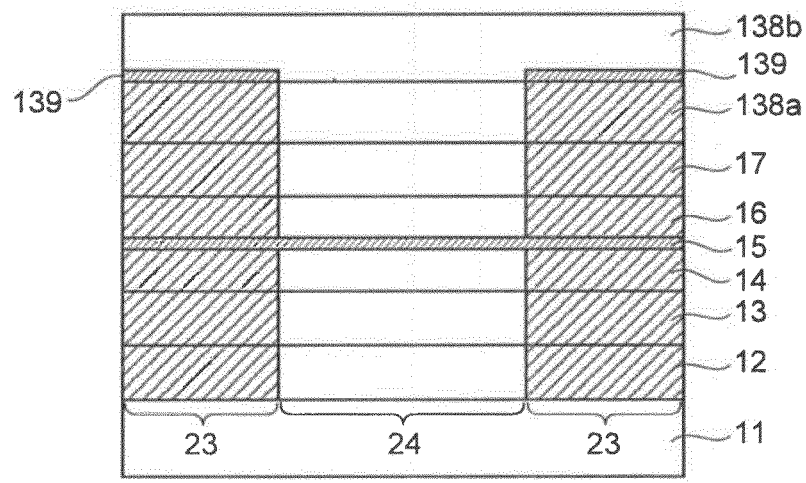
FIG. 23 is an explanatory diagram for the manufacturing method of the semiconductor laser element depicted in FIG. 17.

A manufacturing method of the semiconductor laser element depicted in FIG. 17 is explained below with reference to FIG. 19 to FIG. 23. As depicted in FIG. 19, the n-buffer layer 12, the n-cladding layer 13, the n-guide layer 14, the active layer 15, the p-guide layer 16, the p-cladding layer 17, the p-first contact layer 138a, and an n-GaAs layer that forms the current non-injecting layer 139 are formed on the substrate 11 by epitaxial growth. After an $SiO_2$ film 140 is formed, the $SiO_2$ film 140 other than a region corresponding to the current non-injecting layer 139 is removed by photolithography and etching. As depicted in FIG. 20, etching is performed using the $SiO_2$ film 140 as an etching mask, thereby forming the current non-injecting layer 139. The etching mask is not necessarily the $SiO_2$ film, and the promoting film 25 formed in the subsequent step may be used as the etching mask. Etching may be performed by forming only a resist without forming the $SiO_2$ film. Thereafter, as depicted in FIG. 21, the promoting film 25 and the suppression film 26 are formed, and disordering is performed by RTA, thereby forming the window region 23 and the non-window region 24 similarly to the method depicted in FIG. 5 and FIG. 6. As depicted in FIG. 21, the promoting film 25 and the suppression film 26 are removed, and a surface cleaning process is performed on surfaces of the p-first contact layer 138a and the current non-injecting layer 139. Thereafter, as depicted in FIG. 23, p-GaAs is regrown to form the p-second contact layer 138b, and the upper electrode 20 and the lower electrode 21 are formed. A GaAs thin-film layer may be provided on a regrowth interface to prevent surface oxidization after etching on the current non-injecting layer 139. Formation of the promoting film 25, formation of the suppression film 26, RTA, and removal of the promoting film 25 and the suppression film 26 depicted in FIG. 21 are not necessarily performed after forming the current non-injecting layer, and may be performed after forming the n-GaAs layer that forms the current non-injecting layer 139, or after forming the p-second contact layer 138b. The processes described above only need to be performed before forming the upper electrode 20 and with a timing that allows disordering of the active layer 15.

Figure 24:
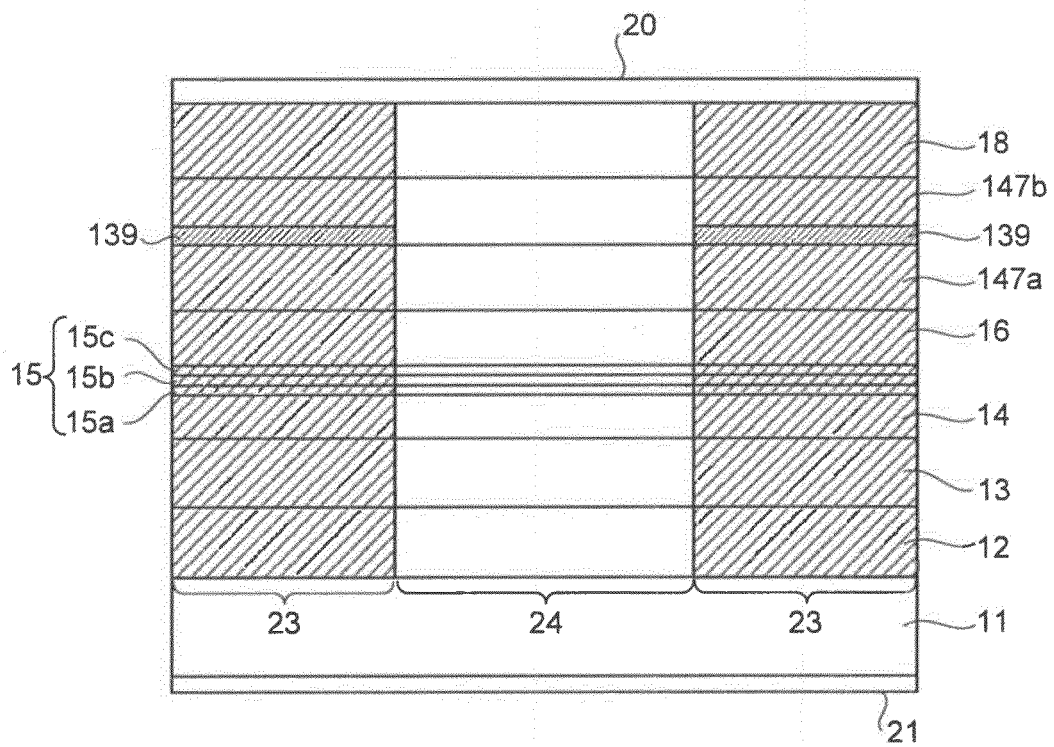
FIG. 24 is another example of a cross section of the semiconductor laser element according to the first embodiment.

While a semiconductor laser element having a horizontal optical mode of multi-mode (hereinafter, "multi-mode") has been explained as a semiconductor laser element including a layer having a current constricting function in FIG. 17, the semiconductor laser element may have horizontal optical mode of single mode (hereinafter, "single mode") as depicted in FIG. 24. In this case, as depicted in FIG. 24, the current non-injecting layer 139 is provided between a p-first cladding layer 147a doped with C and a p-second cladding layer 147b doped with C. That is, C that preferentially substitutes a group-V site is doped on an active layer 15 side of the p-first cladding layer 147a and the p-second cladding layer 147b formed above the active layer 15. When the semiconductor laser element is of a single mode type depicted in FIG. 24, a sufficient difference between an energy band gap in the window region 23 and an energy band gap in the non-window region 24 is similarly obtained by doping C into a layer formed on a side of stacking a p-type cladding with respect to the active layer 15, thereby achieving a highly reliable semiconductor laser element preventing COD.

(Second Embodiment)

A second embodiment is explained next. A semiconductor laser element according to the second embodiment has C doped into a layer near an active layer and has Zn doped into a layer formed on an upper electrode side of the layer doped with C.

Figure 25:
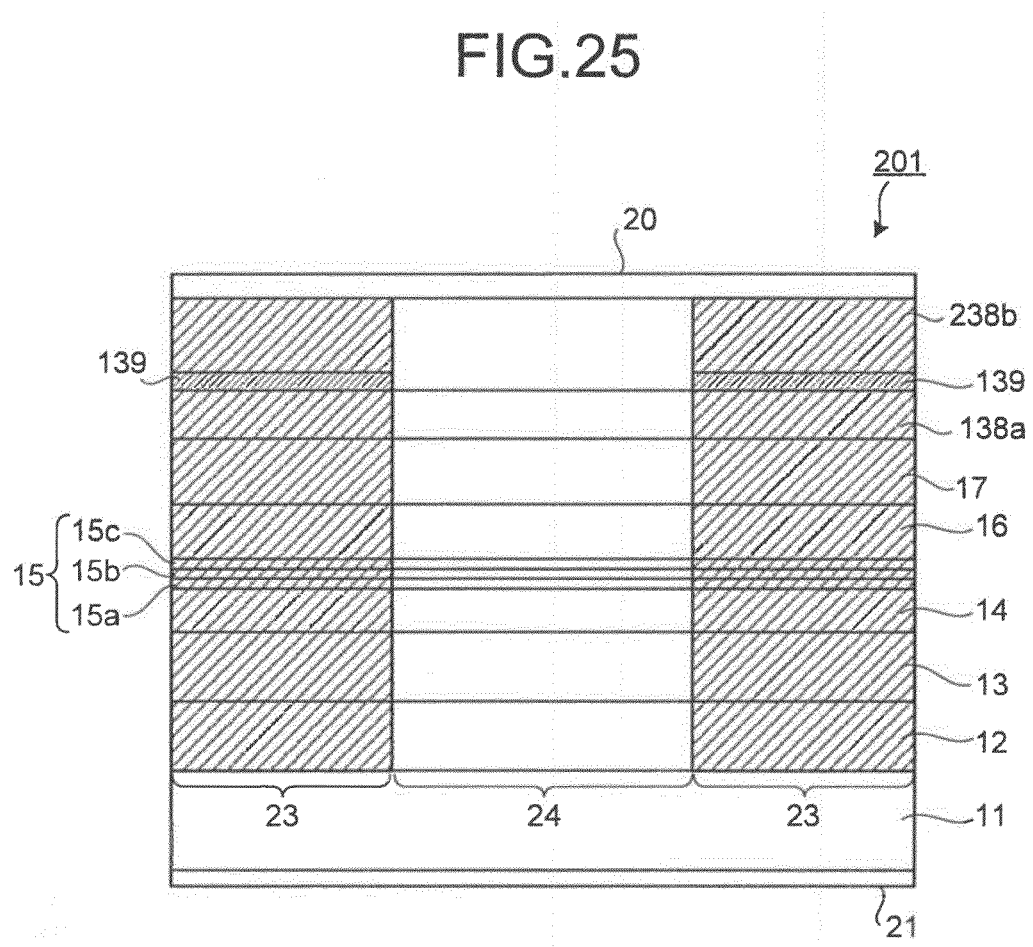
FIG. 25 is a cross section of a semiconductor laser element according to a second embodiment.

FIG. 25 is a cross section of a semiconductor laser according to the second embodiment. As depicted in FIG. 25, a semiconductor laser element 201 according to the second embodiment includes a layer having a current constricting function, and has a p-second contact layer 238b that is doped with Zn as an impurity and formed on the p-first contact layer 138a and the current non-injecting layer 139. In the semiconductor laser element 201, the current non-injecting layer 139 is formed by using a method similar to the method depicted in FIG. 19 and FIG. 20. Thereafter, a surface cleaning process is performed on the p-first contact layer 138a and the current non-injecting layer 139, p-GaAs is regrown, and the p-second contact layer 238b doped with Zn is formed. The window region 23 and the non-window region 24 are formed by using a method similar to the method depicted in FIG. 21 and FIG. 22. Thereafter, the upper electrode 20 and the lower electrode 21 are formed.

As explained above, the semiconductor laser element 201 depicted in FIG. 25 has a structure in which the p-second contact layer 238b doped with Zn as an impurity is formed instead of the p-second contact layer 138b in the semiconductor laser element depicted in FIG. 17 according to the first embodiment.

In the semiconductor laser element depicted in FIG. 17, the p-second contact layer 138b doped with C as an impurity is formed by its regrowth on the p-first contact layer 138a and the current non-injecting layer 139. In this case, C is doped into GaAs by adding halogenated carbon such as $CCl_4$ or CBr4 or by using carbon of an organometallic origin of a semiconductor component such as TMGa or TMAs. To achieve Ohmic contact with an upper electrode, a high concentration of C needs to be doped into the p-second contact layer 238b. For example, while a carrier concentration of the p-first contact layer 138a is $1 \times 10^{18}$ cm$^{-3}$, a carrier concentration of the p-second contact layer 138b is $1 \times 10^{19}$ cm$^{-3}$. To smoothly dope this high concentration of C into GaAs, the p-second contact layer 138b needs to be formed by performing regrowth at a relatively low temperature of about 600° C. or lower.

Figure 26:
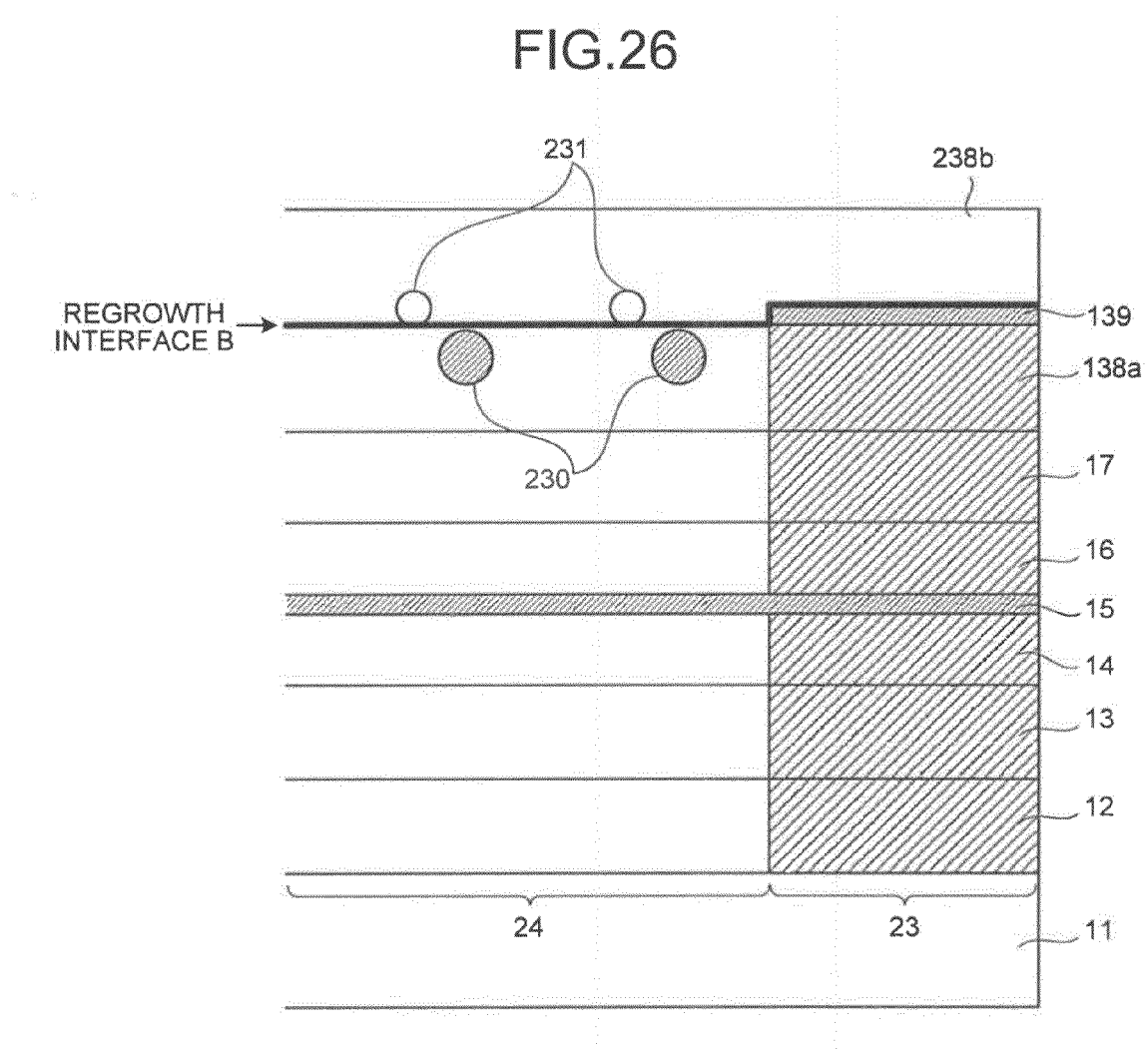
FIG. 26 is an explanatory diagram for a state of a regrowth interface in the semiconductor laser element depicted in FIG. 17.

However, in the semiconductor laser element including a layer having a current constricting function, because forming of the current non-injecting layer 139 is performed, as depicted in FIG. 26, an impurity 230 tends to remain on a regrowth interface B, and crystal quality tends to be degraded. Further, in regrowth performed at a low temperature equal to or lower than 600° C., a point defect 231 attributable to an antisite or a cluster tends to be included. Due to this point defect 231, crystal quality of the regrowth interface B between the p-first contact layer 138a and the p-second contact layer 138b that is doped with C as an impurity becomes sometimes unstable. Consequently, absorption of Ga by the promoting film 25 and diffusion of vacancies to the active layer 15 are inhibited, and the formation of the window region 23 may not be smoothly carried out. Further, in addition to the point defect 231, vacancies may be generated at the regrowth interface B, and the function of suppressing disordering of the suppression film 26 may not function adequately due to the diffusion of the generated vacancies into the active layer 15.

In contrast, in the semiconductor laser element 201 according to the second embodiment, the p-second contact layer 238b is formed by doping a high concentration of Zn into GaAs. In doping Zn, regrowth is performed at a high temperature of, for example, 650° C. or higher, which is higher than that for doping C. Because regrowth is performed at a high temperature in the semiconductor laser element 201, generation of a point defect is considered to be suppressed. Thus, in the semiconductor laser element 201, the degradation of the promoting function of the promoting film 25 and degradation of the suppression function that are attributable to the point defect is considered to be low. Zn has a characteristic of being easily diffused as compared with C. However, the semiconductor laser element 201 has the p-guide layer 16, the p-cladding layer 17, and the p-first contact layer 138a, which are between the p-second contact layer 238b doped with Zn and the active layer 15. Particularly, the p-cladding layer 17 is formed with a thick film thickness of 1 micrometer to 2 micrometers. Therefore, in the semiconductor laser element 201, a distance by which Zn does not reach the active layer 15 even if Zn is diffused by RTA is provided between the p-second contact layer 238b and the active layer 15. Consequently, even if RTA is performed, Zn does not reach the active layer 15, and laser oscillation performance of the quantum well layer 15b in the non-window region 24 is considered to be not hindered.

Figure 27:
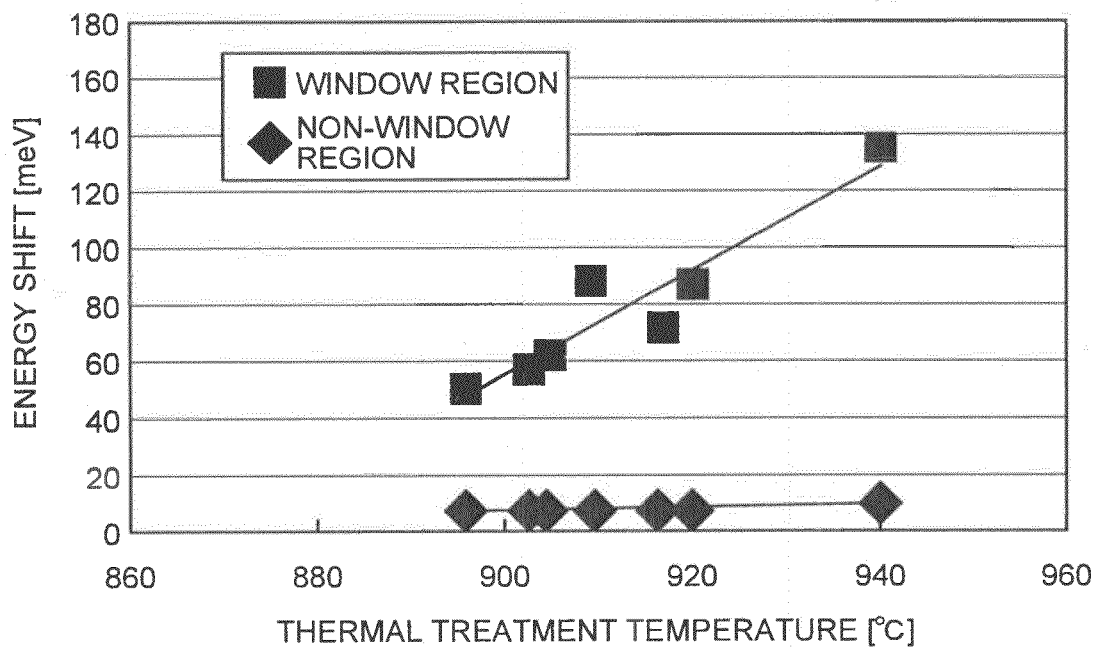
FIG. 27 depicts a relationship between thermal treatment temperatures of RTA and energy shift amounts in a window region and a non-window region of the semiconductor laser element depicted in FIG. 25.

A difference between an energy band gap in the window region and an energy band gap in the non-window region of the semiconductor laser element 201 is explained. FIG. 27 depicts a relationship between thermal treatment temperatures of RTA and energy shift amounts in the window region and the non-window region of the semiconductor laser element 201. As depicted in FIG. 27, by performing RTA at 900° C., a difference between the energy band gap in the window region 23 and the energy band gap in the non-window region 24 of 50 meV or greater is obtained. Further, even when RTA is performed at a thermal treatment temperature of 900° C. or higher, for example at 940° C., the energy-shift amount in the non-window region 24 is suppressed low, and a large energy-shift amount is obtained in the window region 23. In the semiconductor laser element 201, because the p-guide layer 16, the p-cladding layer 17, and the p-first contact layer 138a are formed between the active layer 15 and the p-second contact layer 238b, it is considered that the diffused Zn does not reach the active layer 15 even if Zn is diffused from the p-second contact layer 238b by RTA. In other words, in the semiconductor laser element 201, a distance between the active layer 15 and the p-second contact layer 238b is set to a distance in which Zn diffused from the p-second contact layer 238b is unable to reach the active layer 15. Particularly, because the p-cladding layer 17 has a thickness of 1 micrometer to 2 micrometers, it is considered that Zn diffused from the p-second contact layer 238b is unable to reach the active layer 15. Although an energy difference between energy band gaps needs to be equal to or larger than 50 meV, 70 meV is more preferable, and 100 meV is even more preferable. It is understood from an example of FIG. 27 that thermal treatment temperatures corresponding to energy differences of 50 meV, 70 meV, and 100 meV are approximately 905° C., 912° C., and 925° C., respectively.

Figure 28:
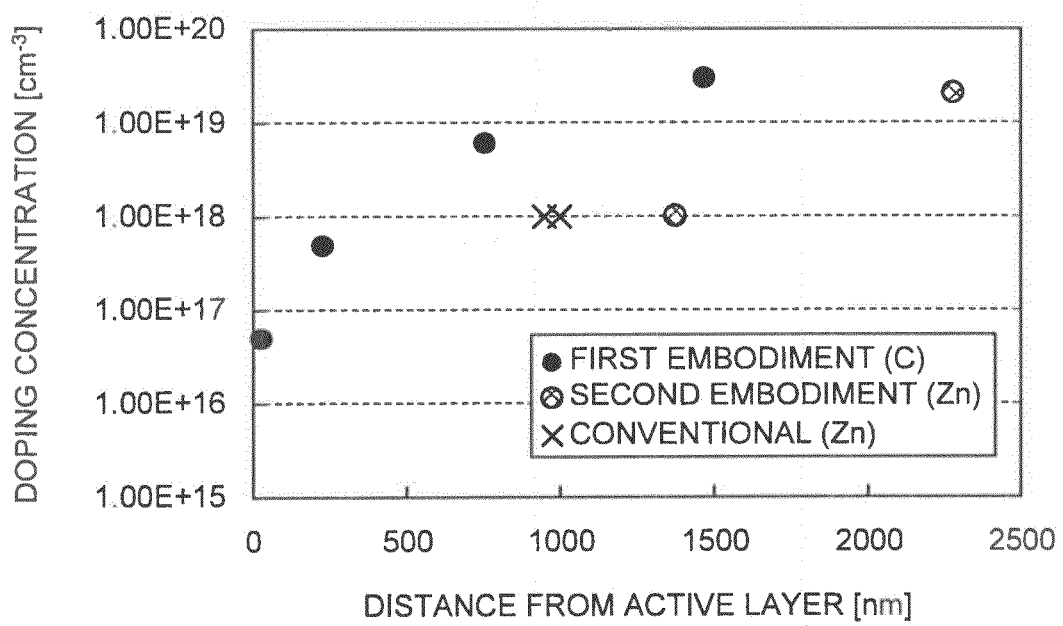
FIG. 28 depicts a relationship between distances of C from an active layer in the first embodiment, Zn from an active layer in the second embodiment, and Zn from an active layer in the conventional technique, and doping concentrations of these impurities.

FIG. 28 depicts a relationship between a distance of C from an active layer in the first embodiment, Zn from an active layer in the second embodiment, and Zn from an active layer in the conventional technique, and doping concentrations of these impurities. A distance of Zn doped in a semiconductor laser from an active layer in the conventional technique is as short as about 1000 nanometers, and a distance of doped Zn from an active layer in the second embodiment is as long as about 1400 nanometers. Further, in the second embodiment, by increasing a distance of the doped Zn from an active layer to about 2300 nanometers, doping concentration of Zn can be increased to about $1.0 \times 10^{19}$ cm$^{-3}$ which is about the same as the doping concentration of C doped in the semiconductor laser element 1 according to the first embodiment. Therefore, in the semiconductor laser element 201 according to the second embodiment, a doping concentration of Zn can be flexibly set to match different uses of the semiconductor laser element 201, by increasing a distance of the doped Zn from the active layer to equal to or longer than a diffusion distance of Zn dependent on a thermal treatment temperature of RTA. As explained above, in the second embodiment, by increasing a distance of Zn as an impurity from an active layer, Zn can be prevented from reaching the active layer, as depicted in FIG. 28. Accordingly, it is possible to select Zn, in addition to C, as an impurity to achieve a highly reliable semiconductor laser.

In this manner, in the second embodiment, by increasing a distance between the active layer 15 and a layer doped with Zn to equal to or more than a diffusion distance of Zn dependent on a thermal treatment temperature of RTA, a highly reliable semiconductor laser element preventing COD is achieved even when Zn is selected as an impurity. In the second embodiment, by setting a distance between the active layer 15 and a layer doped with Zn correspondingly with a diffusion distance of Zn upon RTA, it is possible to select Zn as an impurity. Therefore, the selection for impurity to be doped in each layer is improved.

As described above, in the semiconductor laser element 1 having the p-second contact layer 138*b* formed by regrowth at a low temperature of about 600° C. or lower for doping C, there is a risk of destabilization of crystal quality in a regrowth interface between the p-first contact layer 138*a* and the p-second contact layer 138*b*. However, it is considered that destabilization of crystal quality in the regrowth interface is preventable by performing a surface cleaning process at a high temperature before regrowing the p-second contact layer 138*b*. For example, by performing a surface cleaning process in arsine at a high temperature of 650° C. or higher, residual of an impurity is prevented, and crystal quality at the regrowth interface is stabilized. As a result, absorption of Ga by the promoting film 25, diffusion of vacancies into the active layer 15, and a function of suppressing disordering by the suppression film 26 are performed adequately, and it is considered that an even more reliable semiconductor laser element can be achieved.

Figure 29:
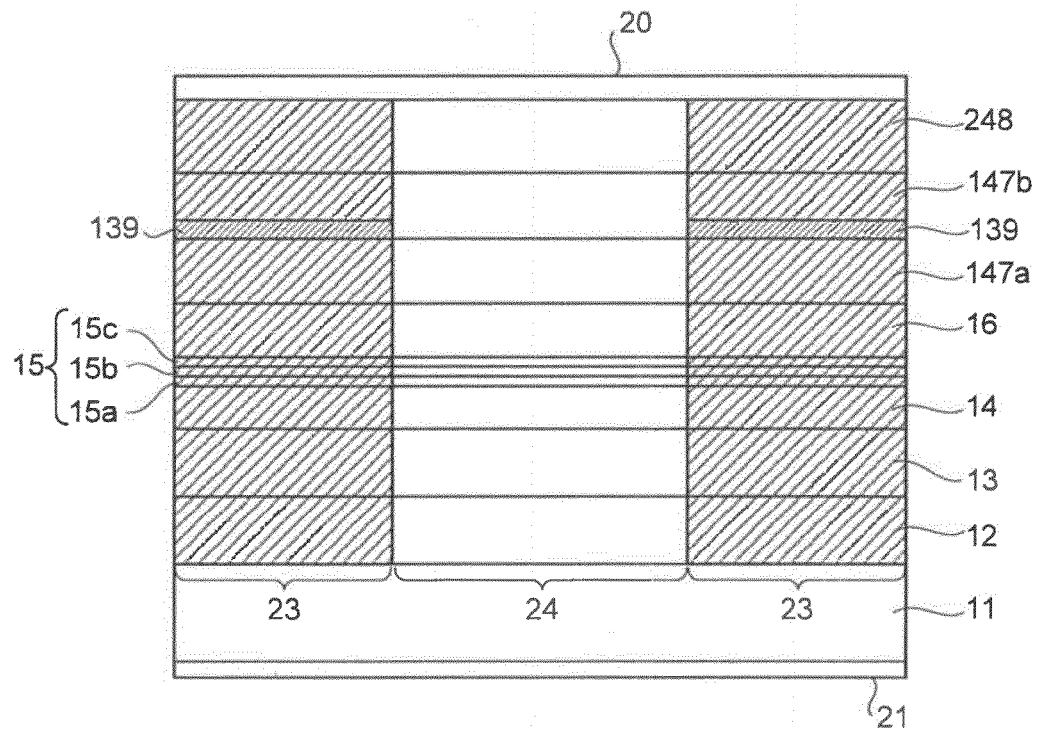
FIG. 29 is another example of a cross section of the semiconductor laser element according to the second embodiment.

While the semiconductor laser element 201 of a multi-mode type has been explained in the second embodiment, as depicted in FIG. 29, of course the semiconductor laser element may be of a single mode type. The semiconductor laser element depicted in FIG. 29 has a p-contact layer 248 doped with Zn as an impurity instead of the p-contact layer 18 in the semiconductor laser element of the single-mode type according to the first embodiment depicted in FIG. 24. In this case, film thicknesses of the p-guide layer 16, the p-first cladding layer 147*a*, and the p-second cladding layer 147*ba* may be adjusted to make a distance between the active layer 15 and the p-contact layer 248 doped with Zn equal to or larger than a diffusion distance of Zn dependent on a thermal treatment temperature of RTA. Particularly, Zn diffused from the p-contact layer 248 is considered to be unable to reach the active layer 15, by setting a total of the film thicknesses of the p-first cladding layer 147*a* and the p-second cladding layer to 1 micrometer to 2 micrometers.

Figure 30:
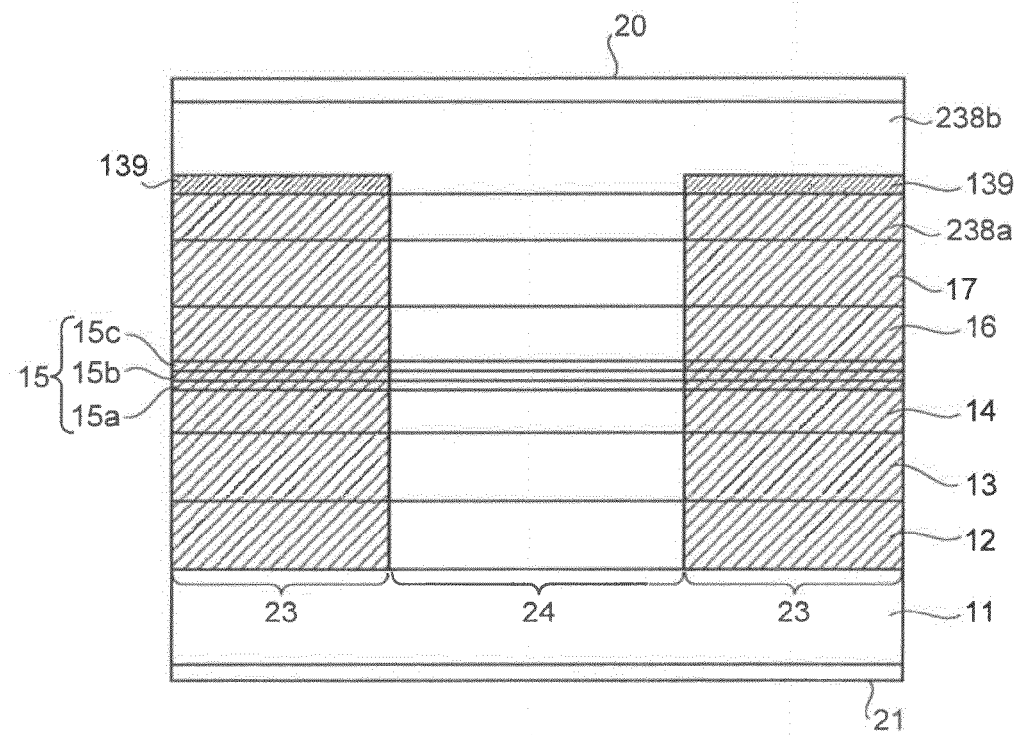
FIG. 30 is another example of a cross section of the semiconductor laser element according to the second embodiment.

When a distance between the active layer 15 and a layer doped with Zn is set equal to or longer than a diffusion distance of Zn dependent on a thermal treatment temperature of RTA, a p-first contact layer 238*a* doped with Zn as an impurity may be formed instead of the p-first contact layer 138*a* in the semiconductor laser element 201 depicted in FIG. 25, as depicted in FIG. 30. In this case, because a film thickness of the p-cladding layer 17 is as large as 1 micrometer to 2 micrometers, Zn diffused from the p-first contact layer 238*a* and the p-second contact layer 238*b* is considered to be unable to reach the active layer 15.

Figure 31:
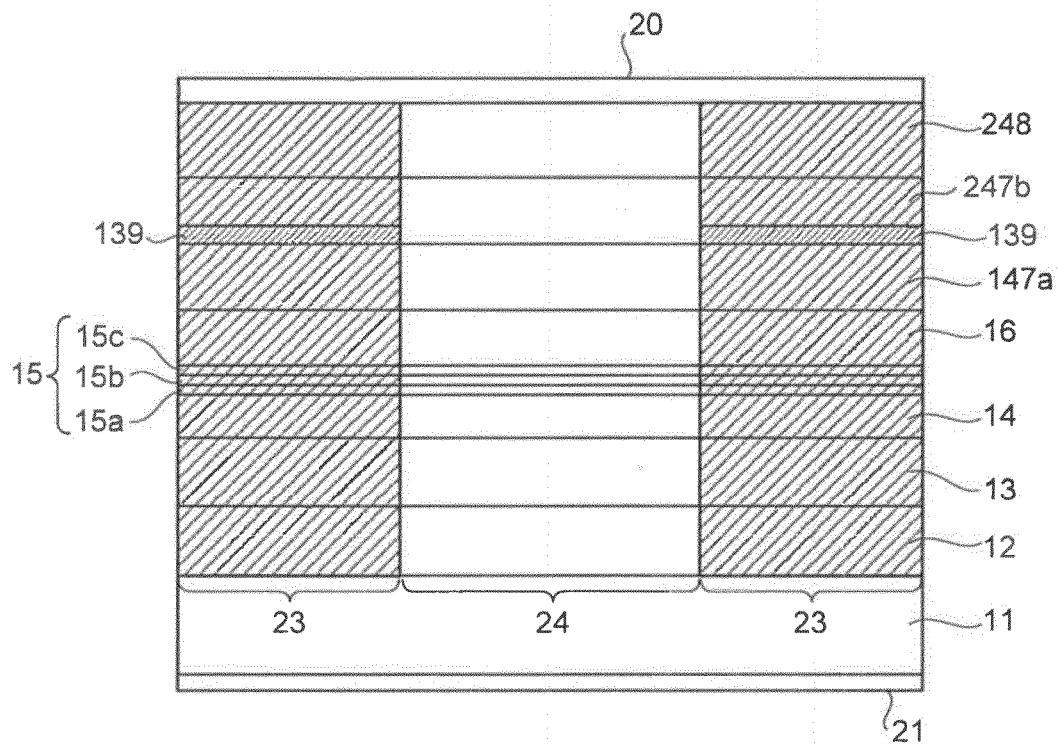
FIG. 31 is another example of a cross section of the semiconductor laser element according to the second embodiment.

Not being limited to the semiconductor laser element of the multi-mode type, the semiconductor laser element may be of a single-mode type formed with a p-second cladding layer 247*b* doped with Zn as an impurity in place of the p-second cladding layer 147*b* in the semiconductor laser element depicted in FIG. 29, as depicted in FIG. 31. In this case, film thicknesses of the p-guide layer 16 and the p-first cladding layer 147*a* may be adjusted to set a distance between the active layer 15 and the p-second cladding layer 247*b* doped with Zn to be equal to or larger than a diffusion distance of Zn dependent on a thermal treatment temperature of RTA. For example, diffused Zn is considered to be unable to reach the active layer 15, by setting a film thickness of the p-first cladding layer 147*a* to 1 micrometer to 2 micrometers.

Figure 32:
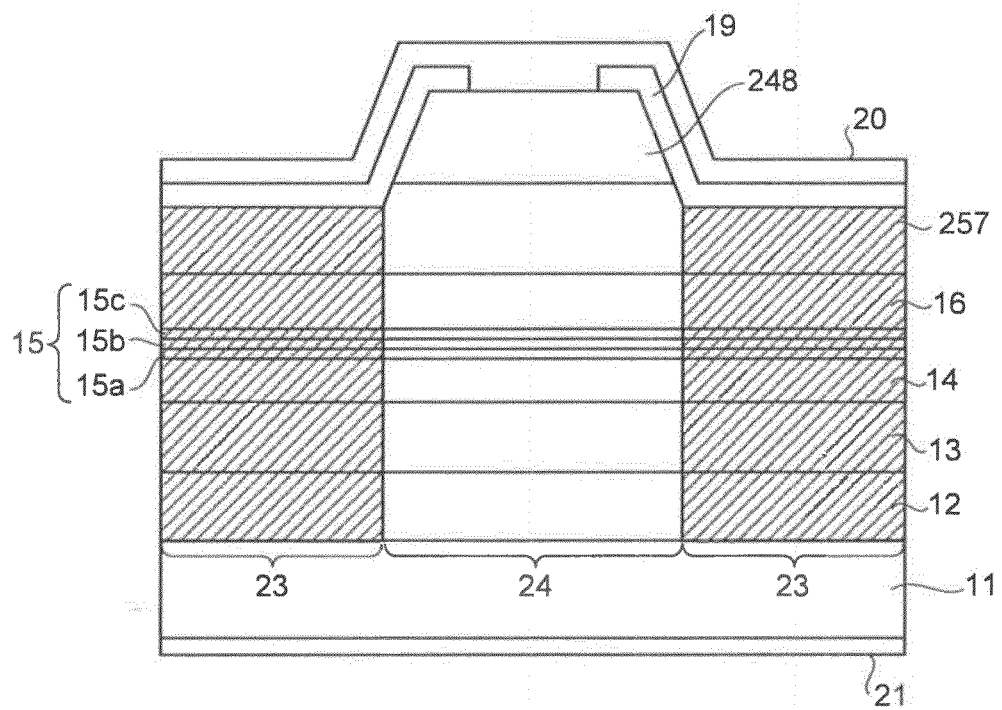
FIG. 32 is another example of a cross section of the semiconductor laser element according to the second embodiment.

The present invention is not limited to a semiconductor laser element including a layer having a current constricting function, and may be applied to a semiconductor laser element of a ridge structure. For example, the p-contact layer 248 doped with Zn as an impurity is formed as depicted in FIG. 32, instead of the p-contact layer 18 in the semiconductor laser element 1 depicted in FIG. 2 as the example of the first embodiment. In this case, film thicknesses of the p-guide layer 16 and the p-cladding layer 17*a* may be adjusted to set distances from the active layer 15 to the p-contact layer 248 and a p-cladding layer 257 doped with Zn to be equal to or larger than a diffusion distance of Zn dependent on a thermal treatment temperature of RTA. For example, diffused Zn is considered to be unable to reach the active layer 15, by setting a film thickness of the p-cladding layer 17 to 1 micrometer to 2 micrometers. Further, the p-cladding layer 257 doped with Zn as an impurity is formed as depicted in FIG. 32, instead of the p-cladding layer 17 in the semiconductor laser element 1 depicted in FIG. 2. In this case, distances from the active layer 15 to the p-contact layer 248 and the p-cladding layer 257 doped with Zn is set equal to or larger than a diffusion distance of Zn dependent on a thermal treatment temperature of RTA, by decreasing a thermal treatment temperature of RTA, shortening a thermal treatment time period of RTA, and adjusting a concentration distribution of Zn, in addition to adjusting a film thickness of the p-guide layer 16. As explained above, in the semiconductor laser element according to the second embodiment, a distance between the active layer 15 and a layer doped with Zn is set equal to or larger than a diffusion distance of Zn dependent on a thermal treatment temperature of RTA, and C is doped into a layer near the active layer 15. As a result, even if Zn is selected as an impurity, it is considered that COD is able to be prevented.

Figure 33:
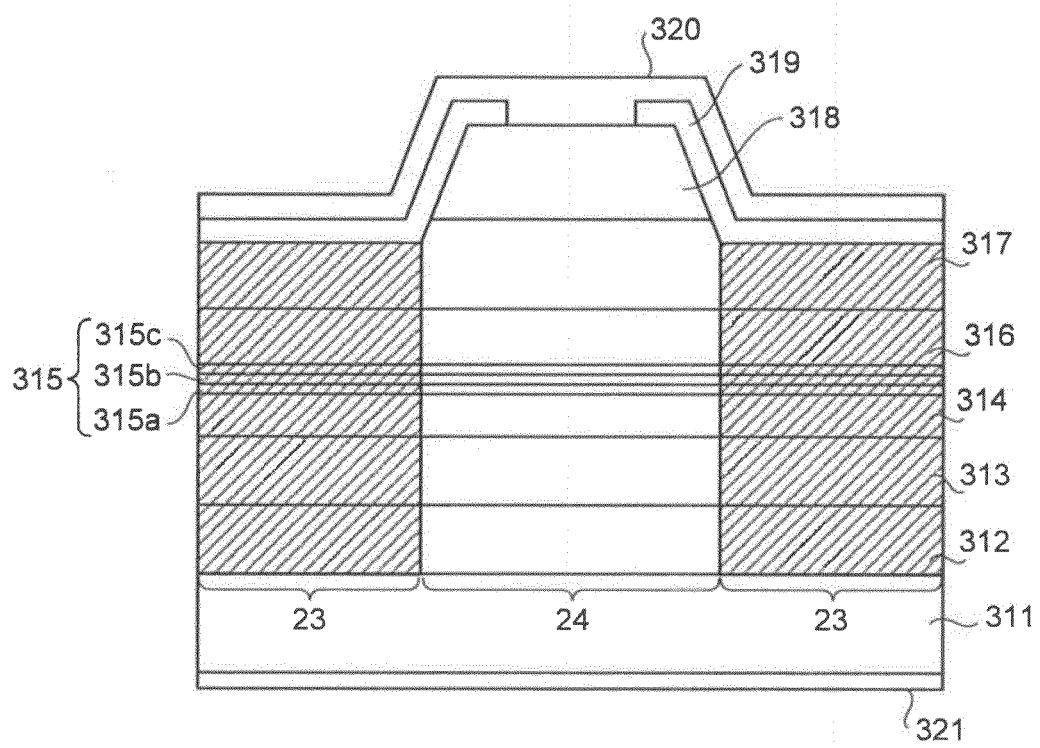
FIG. 33 is another example of a cross section of the semiconductor laser element according to the first and second embodiments.

While formation of a p-type semiconductor film layer doped with C as an impurity on an active layer has been explained, if an n-type semiconductor film layer is to be formed on an active layer, preferably, Se is doped as an impurity as depicted in FIG. 33, for example. Se is a group-VI atom, and in a group-III-V compound semiconductor, Se enters a group-V site and becomes a donor. In GaAs, Se preferentially substitutes the group-V site which is a group different from Ga that occupies the group-III absorbed by the promoting film 25. Further, because Se has a very small diffusion coefficient like C, degradation in the promoting function of the promoting film and degradation in the suppression function of the suppression film are considered to be reduced, even if RTA is performed. A substrate 311, a p-buffer layer 312, a p-cladding layer 313, a p-guide layer 314, a lower barrier layer 315a, an upper barrier layer 315c, an n-guide layer 316, an n-cladding layer 317, and an n-contact layer 318 in a semiconductor laser element depicted in FIG. 33 are formed of layer materials having n and p types opposite to those of layers in corresponding stacking positions in a stacking direction of the substrate 11, which are the n-buffer layer 12, the n-cladding layer 13, the n-guide layer 14, the lower barrier layer 15a, the upper barrier layer 15c, the p-guide 16, the p-cladding layer 17, and the p-contact layer 18 depicted in FIG. 2, respectively. The n-guide layer 316, the n-cladding layer 317, and the n-contact layer 318 are doped with Se.

According to an embodiment of the present invention, by doping an impurity that preferentially substitutes a group-V site into a layer near an active layer, it is possible to prevent promotion of disordering in a window region and suppression of disordering in a non-window region from degrading, and to increase a difference between an energy band gap in the window region and an energy band gap in the non-window region. Therefore, it is possible to realize a highly reliable semiconductor laser element suppressing COD even if the semiconductor laser element is driven under severe conditions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser element, comprising: an active layer;
    a window region including a disordered portion formed by diffusion of a group-III vacancy, the window region including an impurity free disordered portion of the active layer;
    a non-window region including a portion of the active layer having a quantum well structure; and
    a layer near the active layer, the layer being doped with an impurity that preferentially substitutes a group-V site,
    wherein the impurity that preferentially substitutes the group-V site has a diffusion coefficient equal to or smaller than $3 \times 10^{-14}$ cm$^2$/s at a thermal treatment temperature at which the disordered portion is formed, the layer near the active layer is a guide layer formed directly on the active layer, the impurity that preferentially substitutes the group-V site is doped at least on the active layer side of the guide layer, and a concentration of the impurity that preferentially substitutes the group-V site in the guide layer is from $0.1 \times 10^{17}$ cm$^{-3}$ to $1 \times 10^{17}$ cm$^{-3}$, and
    wherein a difference between an energy band gap in the window region and an energy band gap in the non-window region is equal to or larger than 50 meV.

2. The semiconductor laser element according to claim 1, wherein the impurity that preferentially substitutes the group-V site is doped at least on the active layer side of a cladding layer formed above the active layer.

3. The semiconductor laser element according to claim 2, further comprising a current non-injecting layer that is provided in the midst of the cladding layer or in the midst of a contact layer, constricts a current injected from outside, and supplies the current to the active layer, wherein the cladding layer or the contact layer includes:
    a first layer on which the current non-injecting layer is formed; and
    a second layer regrown after a surface cleaning process is performed at a temperature of 650° C. or higher after the current non-injecting layer is formed, or a second layer formed by performing regrowth at a temperature of 650° C. or higher.

4. The semiconductor laser element according to claim 1, wherein the impurity that preferentially substitutes the group-V site is doped at least on the active layer side of a contact layer formed above the active layer to inject a carrier into the active layer.

5. The semiconductor laser element according to claim 4, further comprising a current non-injecting layer that is provided in the midst of a cladding layer or in the midst of the contact layer, constricts a current injected from outside, and supplies the current to the active layer, wherein the cladding layer or the contact layer includes:
    a first layer on which the current non-injecting layer is formed; and
    a second layer regrown after a surface cleaning process is performed at a temperature of 650° C. or higher after the current non-injecting layer is formed, or a second layer formed by performing regrowth at a temperature of 650° C. or higher.

6. The semiconductor laser element according to claim 1, wherein the impurity that preferentially substitutes the group-V site is carbon.

7. The semiconductor laser element according to claim 6, further comprising a current non-injecting layer that is provided in the midst of a cladding layer or in the midst of a contact layer, constricts a current injected from outside, and supplies the current to the active layer, wherein the cladding layer or the contact layer includes:
    a first layer on which the current non-injecting layer is formed; and
    a second layer regrown after a surface cleaning process is performed at a temperature of 650° C. or higher after the current non-injecting layer is formed, or a second layer formed by performing regrowth at a temperature of 650° C. or higher.

8. The semiconductor laser element according to claim 1, wherein the semiconductor laser element has a ridge structure.

9. The semiconductor laser element according to claim 8, further comprising a current non-injecting layer that is provided in the midst of a cladding layer or in the midst of a contact layer, constricts a current injected from outside, and supplies the current to the active layer, wherein the cladding layer or the contact layer includes:
    a first layer on which the current non-injecting layer is formed; and
    a second layer regrown after a surface cleaning process is performed at a temperature of 650° C. or higher after the current non-injecting layer is formed, or a second layer formed by performing regrowth at a temperature of 650° C. or higher.

10. The semiconductor laser element according to claim 1, wherein the guide layer has a function of not inhibiting the diffusion of the group-III vacancy.

11. The semiconductor laser element according to claim 1, wherein the guide layer is a semiconductor layer.

* * * * *